US012672403B2

(12) United States Patent
Nitta et al.

(10) Patent No.: US 12,672,403 B2
(45) Date of Patent: Jun. 30, 2026

(54) WAVELENGTH CONVERTER AND LIGHT EMITTING DEVICE PROVIDED THEREWITH

(71) Applicant: Panasonic Intellectual Property Management Co., Ltd., Osaka (JP)

(72) Inventors: Mitsuru Nitta, Kyoto (JP); Ryosuke Shigitani, Osaka (JP); Emi Miyazaki, Osaka (JP); Toru Hirano, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 340 days.

(21) Appl. No.: 18/275,863

(22) PCT Filed: Feb. 1, 2022

(86) PCT No.: PCT/JP2022/003779
§ 371 (c)(1),
(2) Date: Aug. 4, 2023

(87) PCT Pub. No.: WO2022/176597
PCT Pub. Date: Aug. 25, 2022

(65) Prior Publication Data
US 2024/0128413 A1 Apr. 18, 2024

(30) Foreign Application Priority Data
Feb. 18, 2021 (JP) ................................. 2021-024564

(51) Int. Cl.
*H10H 20/851* (2025.01)
(52) U.S. Cl.
CPC .... *H10H 20/8513* (2025.01); *H10H 20/8515* (2025.01)
(58) Field of Classification Search
CPC ............ H10H 20/8513; H10H 20/8515; B32B 18/00; C04B 2235/3224;
(Continued)

(56) References Cited

U.S. PATENT DOCUMENTS 8,337,032 B2 * 12/2012 Nagai ................ H10H 20/8514
362/230
2011/0090696 A1 4/2011 Nagai et al.
(Continued)

FOREIGN PATENT DOCUMENTS

| JP | 2013-197395 A1 | 9/2013 |
| JP | 2014-002980 A | 1/2014 |

(Continued)

OTHER PUBLICATIONS

Beata Malysa, Andries Meijerink, Thomas Jüstel, Temperature dependent Cr3+ photoluminescence in garnets of the type X3Sc2Ga3O12 (X=Lu, Y, Gd, La), Journal of Luminescence, vol. 202, 2018, pp. 523-531 (Year: 2018).*

(Continued)

*Primary Examiner* — Mark W Tornow
(74) *Attorney, Agent, or Firm* — Renner, Otto, Boisselle & Sklar, LLP

(57) ABSTRACT

Provided is a wavelength converter including a phosphor ceramic containing a first phosphor that emits fluorescence due to a parity-forbidden transition, and a phosphor part containing a second phosphor that emits fluorescence due to a parity-allowed transition. A main surface of the phosphor ceramic has a concave and convex structure including a plurality of convex parts and a plurality of concave parts. The phosphor part is arranged inside the plurality of concave parts in the phosphor ceramic. Also provided is a light emitting device including the wavelength converter, and a solid-state light source that emits light with which the wavelength converter is irradiated and which has a light emission peak within a wavelength range of 400 nm or more and less than 500 nm.

14 Claims, 10 Drawing Sheets

(58) Field of Classification Search

CPC .... C04B 2235/3225; C04B 2235/3241; C04B 2235/3286; C04B 2235/6562; C04B 2235/6565; C04B 2235/764; C04B 2237/34; C04B 2237/343; C04B 35/01; C04B 35/50; C04B 2237/62; C04B 2237/704; C04B 2237/84; C09K 11/7769; C09K 11/7774; G03B 21/2033; G03B 21/204; F21Y 2115/30; F21V 9/38; F21V 29/502; F21V 9/32

See application file for complete search history.

(56) References Cited

U.S. PATENT DOCUMENTS

| | | | |
|---|---|---|---|
| 2013/0250248 A1 | 9/2013 | Ogura | |
| 2016/0372639 A1* | 12/2016 | Mueller | H10H 20/8513 |
| 2018/0274737 A1 | 9/2018 | Abe et al. | |
| 2019/0091355 A1* | 3/2019 | Ukawa | F21K 9/00 |
| 2019/0248119 A1* | 8/2019 | Yonemoto | C09K 11/08 |
| 2019/0258098 A1* | 8/2019 | Oba | F21V 9/00 |
| 2019/0323664 A1 | 10/2019 | Abe et al. | |
| 2020/0103095 A1 | 4/2020 | Sugimura et al. | |
| 2020/0109331 A1 | 4/2020 | Oshio et al. | |
| 2020/0309348 A1 | 10/2020 | Shibata et al. | |
| 2021/0325022 A1 | 10/2021 | Okuno | |
| 2022/0175250 A1 | 6/2022 | Abe et al. | |

FOREIGN PATENT DOCUMENTS

| | | | |
|---|---|---|---|
| JP | 2016-161709 A | 9/2016 | |
| JP | 2019-179920 A | 10/2019 | |
| JP | 2020-52234 A | 4/2020 | |
| JP | 2020-166012 A | 10/2020 | |
| WO | 2018/084282 A1 | 5/2018 | |
| WO | 2018/230207 A1 | 12/2018 | |
| WO | 2020/066615 A1 | 4/2020 | |
| WO | 2020/217671 A1 | 10/2020 | |

OTHER PUBLICATIONS

Extended European Search Report for corresponding EP Application No. 22755918.4 dated Jul. 12, 2024.
International Search Report for corresponding Application No. PCT/JP2022/003779, mailed Apr. 26, 2022.
Written Opinion for corresponding Application No. PCT/JP2022/003779, mailed Apr. 26, 2022.
Office Action for corresponding CN Application No. 202280013194.1 issued Mar. 25, 2026, with English machine translation.

* cited by examiner (a)

(b)

(a)

(b)

(a)

(b)

(c)

(d)

WAVELENGTH CONVERTER AND LIGHT EMITTING DEVICE PROVIDED THEREWITH

TECHNICAL FIELD

The present invention relates to a wavelength converter and a light emitting device using the wavelength converter.

BACKGROUND ART

There are known light emitting devices that combine a solid-state light source that emits primary light such as laser light with a wavelength converter that contains a phosphor. As such a light emitting device, a laser lighting device or a laser projector is known, for example. These light emitting devices use a phosphor wheel type wavelength converter that is rotated by a rotary driving device such as a motor.

Patent Literature 1 discloses a light source device provided with a light source and a phosphor wheel including a first substrate and a second substrate. The phosphor wheel includes a first phosphor and a second phosphor arranged between the first substrate and the second substrate, and the first phosphor and the second phosphor are arranged at different positions in the direction of rotation of the phosphor wheel. The first phosphor is in contact with the first and second substrates, and the second phosphor is in contact with the second substrate. Such a configuration is less affected by heat generation of the phosphors and suppresses a decrease in light emission efficiency.

PATENT LITERATURE

Patent Literature 1: Japanese Unexamined Patent Application Publication No. 2016-161709

SUMMARY OF INVENTION

However, a phosphor wheel type wavelength converter needs to be rotated using a rotary driving device, and this complicates the structure of the light emitting device and makes a reduction in size difficult. In addition, the use of a rotary driving device may increase the risk of failure of the light emitting device.

The present invention has been made in consideration of such issues as described above, which are inherent in related art. An object of the present invention is to provide a wavelength converter capable of enhancing the light emission efficiency of a phosphor without using a rotary driving device, and to provide a light emitting device using the wavelength converter.

In response to the above issues, a wavelength converter according to a first aspect of the present invention includes a phosphor ceramic containing a first phosphor that emits fluorescence due to a parity-forbidden transition, and a phosphor part containing a second phosphor that emits fluorescence due to a parity-allowed transition. A main surface of the phosphor ceramic has a concave and convex structure including a plurality of convex parts and a plurality of concave parts, and the phosphor part is arranged inside the plurality of concave parts in the phosphor ceramic.

A light emitting device according to a second aspect of the present invention includes the wavelength converter described above, and a solid-state light source that emits light with which the wavelength converter is irradiated and which has a light emission peak within a wavelength range of 400 nm or more and less than 500 nm.

DESCRIPTION OF EMBODIMENTS

Figure 1:
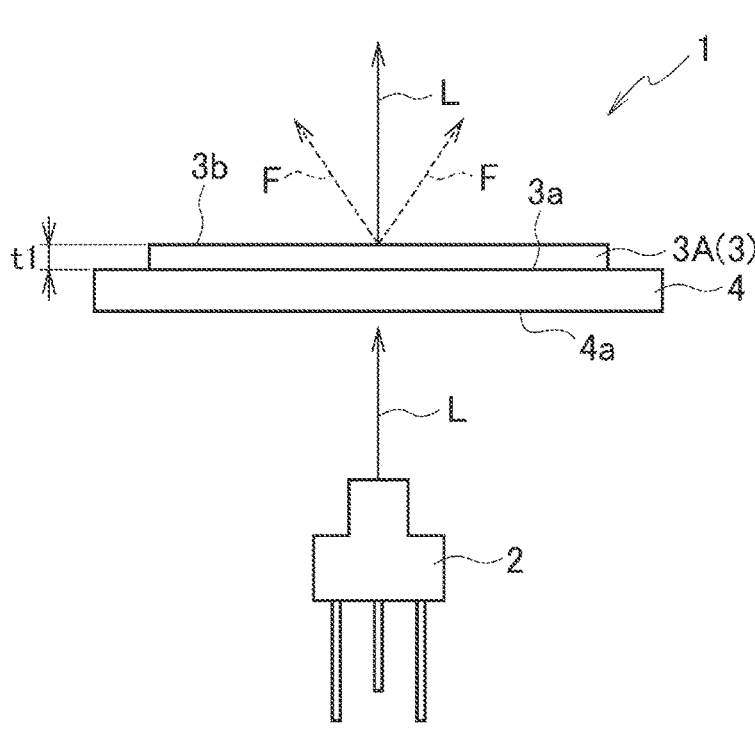
FIG. 1(a) is a schematic diagram illustrating a light emitting device provided with a wavelength converter containing a phosphor that emits fluorescence due to a parity-allowed transition.
FIG. 1(b) is a schematic diagram illustrating a light emitting device provided with a wavelength converter containing a phosphor that emits fluorescence due to a parity-forbidden transition.
Figure 1:
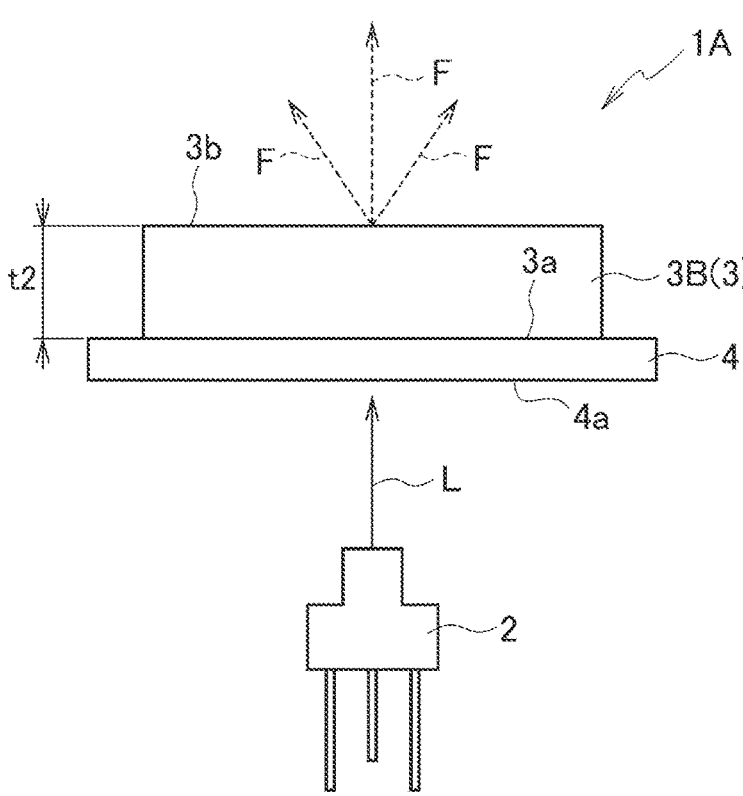

Referring to the drawings, a description is given below of a wavelength converter according to the present embodiment and a light emitting device using the wavelength converter. Note that dimensional ratios in the drawings are exaggerated for convenience of the description and are sometimes different from actual ratios.

An example of a light emitting device made by combining a solid-state light source and a phosphor can be, as illustrated in FIG. 1, a light emitting device provided with a solid-state light source 2 that emits primary light (excitation light), a wavelength converter 3 that contains a phosphor, and a substrate 4 that holds the wavelength converter 3 on the surface of the substrate 4.

The solid-state light source 2 is a light emitting element that emits laser light L as primary light, and a laser diode such as a surface emitting laser diode can be used, for example. The wavelength converter 3 emits fluorescence F having a longer wavelength than that of the laser light L by receiving the laser light L. That is, the wavelength converter 3 receives the laser light L at a front surface 3a and emits the fluorescence F from a back surface 3b. The substrate 4 has a transparency that allows the laser light L to pass through, and the laser light L entering from a main surface 4a, which is the surface of the substrate 4, can pass through the substrate 4. For example, a quartz substrate, a sapphire substrate, and a translucent fluorescent ceramic substrate are used as the transparent substrate 4.

In such a light emitting device 1, laser light L emitted on the substrate 4 passes through the substrate 4 and the wavelength converter 3. When the laser light L passes through the wavelength converter 3, the phosphor contained in the wavelength converter 3 absorbs part of the laser light L and emits fluorescence F. Thus, the light emitting device 1 emits light including the laser light L and the fluorescence F, as output light. Hence, for example, when the laser light L is blue and the fluorescence F is yellow, white output light is emitted through additive mixture of the laser light L and the fluorescence F.

Here, when the phosphor contained in a wavelength converter 3 (3A) is a phosphor that emits fluorescence due to a parity-allowed transition, the phosphor has a high transition probability and thus can efficiently absorb laser light L. Specifically, when the phosphor is, for example, yttrium aluminum garnet $(Y_3Al_2(AlO_4)_3:Ce^{3+}, YAG:Ce^{3+})$ activated with $Ce^{3+}$, the phosphor absorbs about 90% of blue laser light L and emits yellow fluorescence F. Thus, as illustrated in FIG. 1(a), when the phosphor contained in the wavelength converter 3A in the light emitting device 1 is a phosphor that emits fluorescence due to a parity-allowed transition, a thickness t1 of the wavelength converter 3A can be made relatively thin. Specifically, the thickness t1 of the wavelength converter 3A can be within a range of 50 μm to 100 μm, for example.

In contrast, when the phosphor contained in a wavelength converter 3 (3B) is a phosphor that emits fluorescence due to a parity-forbidden transition, the phosphor has a low transition probability and thus cannot efficiently absorb laser light L. Specifically, when the phosphor is, for example, a $(Gd, La)_3(Ga, Sc)_2(GaO_4)_3:Cr^{3+}$ phosphor (GSG phosphor) activated with $Cr^{3+}$, the phosphor absorbs about 60% of blue laser light L and emits near-infrared fluorescence F. Thus, as illustrated in FIG. 1(b), when the phosphor contained in the wavelength converter 3B in the light emitting device 1A is a phosphor that emits fluorescence due to a parity-forbidden transition, a thickness t2 of the wavelength converter 3B needs to be made relatively thick to enhance a wavelength conversion efficiency. Specifically, the thickness t2 of the wavelength converter 3B needs to be within a range of 300 μm to 400 μm, for example.

Figure 2:
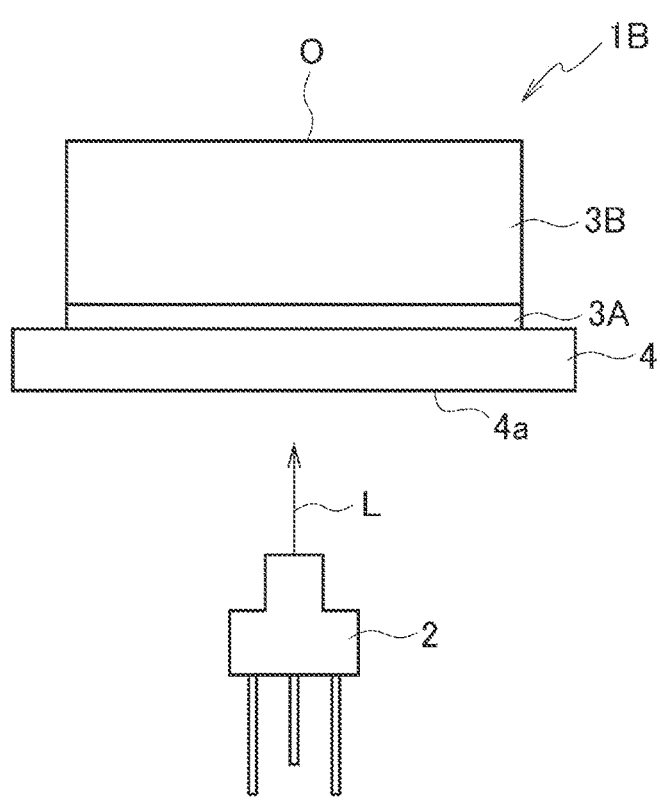
FIG. 2 includes schematic diagrams illustrating a light emitting device provided with both a wavelength converter containing a phosphor that emits fluorescence due to a parity-allowed transition and a wavelength converter containing a phosphor that emits fluorescence due to a parity-forbidden transition.
Figure 2:
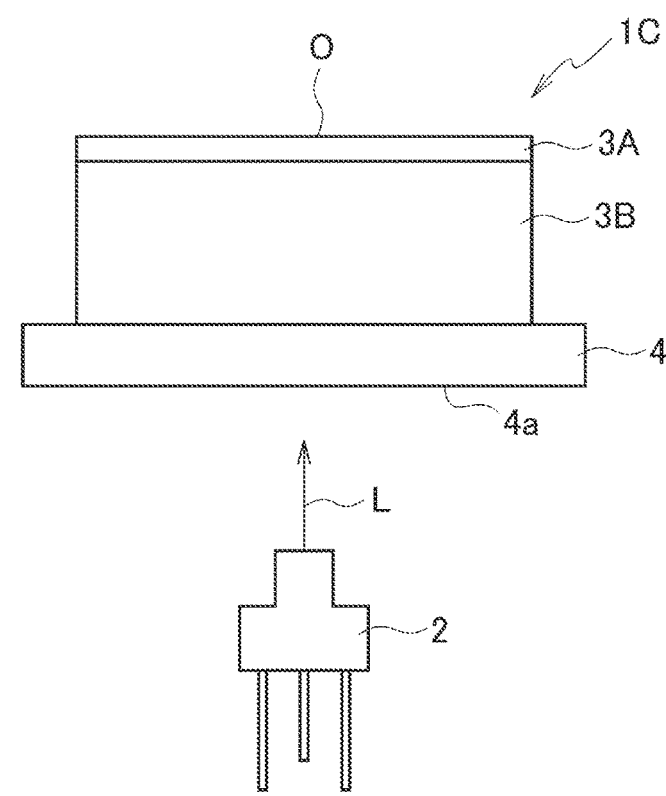

Here, by combining the solid-state light source 2, the wavelength converter 3A, and the wavelength converter 3B described above, a light emitting device that emits both white light and near-infrared light as output light can be obtained. Specifically, a light emitting element that emits blue laser light L is used as the solid-state light source 2, a member including a YAG:Ce^{3+} phosphor is used as the wavelength converter 3A, and a member including a GSG phosphor is used as the wavelength converter 3B. Then, as illustrated in FIG. 2, the wavelength converter 3A and the wavelength converter 3B are stacked on the transparent substrate 4. In a light emitting device 1B illustrated in FIG. 2(a), the wavelength converter 3A is stacked above the substrate 4, and the wavelength converter 3B is further stacked above the wavelength converter 3A. In a light emitting device 1C illustrated in FIG. 2(b), the wavelength converter 3B is stacked above the substrate 4, and the wavelength converter 3A is further stacked above the wavelength converter 3B.

When blue laser light L is emitted from the main surface (bottom surface) 4a of the substrate 4 to such light emitting devices 1B and 1C, the emitted laser light L passes through the substrate 4 and the wavelength converters 3A and 3B. When the laser light L passes through the wavelength converter 3A, the YAG:Ce^{3+} phosphor contained in the wavelength converter 3A absorbs part of the laser light L and emits yellow fluorescence.

When the laser light L passes through the wavelength converter 3B, the GSG phosphor contained in the wavelength converter 3B absorbs part of the laser light L and emits near-infrared fluorescence. Thus, the light emitting device in FIG. 2 can emit from a light emitting surface O both white light and near-infrared light generated through additive mixture of the laser light L and the yellow fluorescence.

Here, as described above, the phosphor contained in the wavelength converter 3A is a phosphor that emits fluorescence due to a parity-allowed transition, and thus the thickness of the wavelength converter 3A can be made relatively thin. In contrast, the phosphor contained in the wavelength converter 3B is a phosphor that emits fluorescence due to a parity-forbidden transition, and thus the thickness of the wavelength converter 3B needs to be made relatively thick to enhance the wavelength conversion efficiency. Thus, in the light emitting device 1B illustrated in FIG. 2(a), yellow fluorescence emitted from the wavelength converter 3A may be blocked by the wavelength converter 3B constituting a thick film and may not be able to sufficiently pass through the wavelength converter 3B. In the light emitting device 1C illustrated in FIG. 2(b), the laser light L passing through the substrate 4 may be absorbed by the wavelength converter 3B and may not be able to sufficiently reach the wavelength converter 3A.

In this way, in the light emitting devices 1B and 1C illustrated in FIG. 2, the wavelength converter 3A and the wavelength converter 3B are stacked in the thickness direction of the substrate 4, and thus the extraction efficiency of the white light may decrease due to the wavelength converter 3B constituting a thick film, resulting in insufficient light emission efficiency as a whole.

The wavelength converter according to the present embodiment has a configuration capable of increasing the light extraction efficiency and improving the light emission efficiency even when it has both a phosphor that emits fluorescence due to a parity-allowed transition and a phosphor that emits fluorescence due to a parity-forbidden transition.

[Wavelength Converter]

Figure 3:
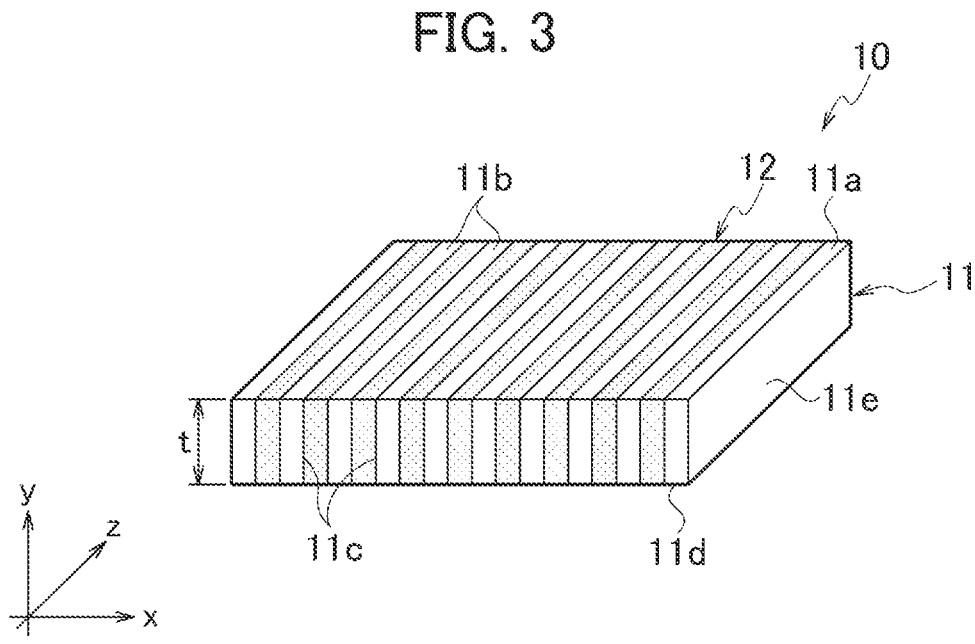
FIG. 3 is a schematic perspective view of an example of a wavelength converter according to the present embodiment.
Figure 4:
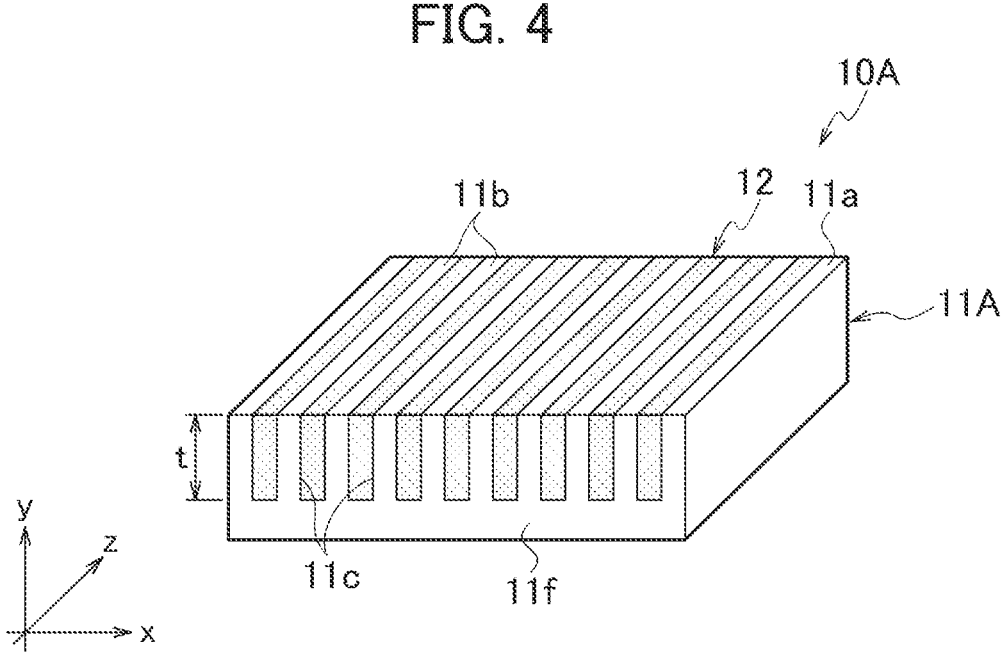
FIG. 4 is a schematic perspective view of another example of the wavelength converter according to the present embodiment.

As illustrated in FIGS. 3 and 4, a wavelength converter 10 according to the present embodiment includes a phosphor ceramic 11 and a phosphor part 12. Multiple convex parts 11b are formed on the main surface 11a of the phosphor ceramic 11, and a concave part 11c is formed between adjacent convex parts 11b. A phosphor part 12 is arranged inside multiple concave parts 11c in the phosphor ceramic 11.

To describe in detail, the wavelength converter 10 includes the phosphor ceramic 11 having an approximately rectangular parallelepiped shape (plate shape) overall. Concave parts 11c are formed by performing notching from one main surface 11a to the other main surface 11d in the phosphor ceramic 11. The concave parts 11c are formed from one end to the other end of the phosphor ceramic 11 along the z-axis direction in FIG. 3. Convex parts 11b are formed between adjacent concave parts 11c. Thus, one main surface 11a of the phosphor ceramic 11 and the other main surface 11d opposite to the main surface 11a have a concave-convex structure of multiple convex parts 11b and multiple concave parts 11c.

The interior of the multiple concave parts 11c is filled with the phosphor part 12. In the wavelength converter 10 of FIG. 3, one main surface 11a and the other main surface 11d of the phosphor ceramic 11 are each flush with the convex parts 11b and the phosphor part 12. Thus, the wavelength converter 10 has a structure in which the convex parts 11b of the phosphor ceramic 11 and pieces of the phosphor part 12 are alternately stacked along the x-axis direction in FIG. 3.

The thickness t of the wavelength converter 10, or in other words, the thickness t of the phosphor ceramic 11, is not particularly limited, but is preferably within a range of 100 μm to 800 μm, more preferably 200 μm to 600 μm, even more preferably 300 μm to 500 μm, for example. As described below, the phosphor ceramic 11 contains a first phosphor that emits fluorescence due to a parity-forbidden transition. Hence, it is necessary to make the thickness t relatively large to increase the wavelength conversion efficiency of the first phosphor, and thus the thickness t is preferably within the above-described ranges.

In the wavelength converter 10, the phosphor ceramic 11 contains the first phosphor that emits fluorescence due to the parity-forbidden transition. The phosphor ceramic 11 is preferably a molded body that contains the first phosphor as a main component and is made entirely from an inorganic material. This causes the phosphor ceramic 11 to have high thermal conductivity, and thus temperature quenching of the first phosphor can be suppressed to enhance the light emission efficiency.

Note that the phosphor ceramic 11 is preferably a sintered body containing the first phosphor, more preferably a sintered body made of the first phosphor. That is, the phosphor ceramic 11 is preferably a sintered body obtained by pressing a powder of the first phosphor or a raw material powder of the first phosphor into a compact and then calcining the compact. Note that the phosphor ceramic 11 may be a molded body obtained by binding the particles of the first phosphor using a binder made from an inorganic material.

The first phosphor is a phosphor that emits fluorescence (first fluorescence) due to a parity-forbidden transition. That is, since the light emission of the first phosphor is caused by a parity-forbidden transition, the absorptivity of excitation light tends to decrease. As such a first phosphor, a phosphor that emits fluorescence based on an electron energy transition of transition metal ions can be used. For example, as the first phosphor, a phosphor containing at least one ion selected from the group consisting of Cr, Mn, Fe, Cu, and Ni as an activator (light emission center element) can be used. Specifically, as the first phosphor, a phosphor containing at least one of $Cr^{3+}$ or $Mn^{4+}$ as an activator can be used. The host of the first phosphor is not particularly limited, and at least one selected from the group consisting of an oxide, a sulfide, a nitride, a halide, an oxysulfide, an oxynitride, and an oxyhalide can be used, for example.

To describe in more detail, the activator for the first phosphor is a fluorescent ion that has a property of absorbing excitation light (primary light) emitted from a solid-state light source and converting it into optical components having a longer wavelength than that of the excitation light. The activator for the first phosphor is an ion capable of emitting fluorescence due to a parity-forbidden transition and is preferably at least one of $Cr^{3+}$ or $Mn^{4+}$, for example.

Examples of the first phosphor include halophosphates, phosphates, halosilicates, silicates, aluminates, aluminosilicates, borates, germanates, silicate nitrides, aluminosilicate nitrides, silicate oxynitrides, and aluminosilicate oxynitrides, to which an activator described above is added. Thus, a suitable phosphor for lighting design may be appropriately selected and used from these.

Here, the activator for the first phosphor is preferably $Cr^{3+}$. By the use of $Cr^{3+}$, the first phosphor can be obtained with the property of absorbing visible light, especially blue light or red light, and converting it into deep-red to near-infrared optical components. In addition, depending on the type of host to which an activator is added, it becomes easy to change a light absorption peak wavelength or a fluorescence peak wavelength of a phosphor, and this is advantageous in changing the shape of the excitation spectrum or the fluorescence spectrum. Furthermore, many $Cr^{3+}$ activated phosphors that absorb blue light or red light and convert it into a near-infrared fluorescent component are also known. This not only broadens the selection of a solid-state light source that emits primary light, but also makes it easier to change the peak wavelength of fluorescence emitted by the first phosphor, and thus provides a light emitting device advantageous for controlling the spectral distribution of output light.

Note that a phosphor in which the fluorescent ion is $Cr^{3+}$ is not particularly limited as long as it absorbs excitation light to convert it into fluorescence having a longer wavelength than that of the excitation light, and can be appropriately selected from known $Cr^{3+}$ activated phosphors. However, it is preferable that the $Cr^{3+}$ activated phosphor be based on a composite metal oxide, which is easy to manufacture.

It is preferable that the $Cr^{3+}$ activated phosphor be a composite oxide phosphor having a garnet-type crystal structure, which has many practical applications. Such a $Cr^{3+}$ activated garnet phosphor is preferably at least one of a rare earth aluminum garnet phosphor or a rare earth gallium garnet phosphor. Specifically, the $Cr^{3+}$ activated garnet phosphor is preferably at least one selected from the group consisting of: $Y_3Al_2(AlO_4)_3{:}Cr^{3+}$, $La_3Al_2(AlO_4)_3{:}Cr^{3+}$, $Gd_3Al_2(AlO_4)_3{:}Cr^{3+}$, $Y_3Ga_2(AlO_4)_3{:}Cr^{3+}$, $La_3Ga_2(AlO_4)_3{:}Cr^{3+}$, $Gd_3Ga_2(AlO_4)_3{:}Cr^{3+}$, $Y_3Sc_2(AlO_4)_3{:}Cr^{3+}$, $La_3Sc_2(AlO_4)_3{:}Cr^{3+}$, $Gd_3Sc_2(AlO_4)_3{:}Cr^{3+}$, $Y_3Ga_2(GaO_4)_3{:}Cr^{3+}$, $La_3Ga_2(GaO_4)_3{:}Cr^{3+}$, $(Gd, La)_3Ga_2(GaO_4)_3{:}Cr^{3+}$, $Gd_3Ga_2(GaO_4)_3{:}Cr^{3+}$, $Y_3Sc_2(GaO_4)_3{:}Cr^{3+}$, $La_3Sc_2(GaO_4)_3{:}Cr^{3+}$, $Gd_3Sc_2(GaO_4)_3{:}Cr^{3+}$, and $(Gd, La)_3(Ga, Sc)_2(GaO_4)_3{:}Cr^{3+}$. The $Cr^{3+}$ activated garnet phosphor may be a solid solution having a phosphor described above as an end component.

In the wavelength converter 10, the first phosphor is preferably a phosphor that contains Cr as a light emission center element and has a light emission peak within a wavelength range of 700 nm or more and less than 1600 nm. Such a first phosphor can absorb excitation light and emit near-infrared light. Thus, by using the wavelength converter 10 including the first phosphor, a light emitting device can be obtained being advantageous for imaging and sensing using near-infrared light as well as for medical and cosmetic applications and the like.

In the wavelength converter 10, the phosphor part 12 contains a second phosphor that emits fluorescence due to a parity-allowed transition. The phosphor part 12 is preferably a sealed body formed by sealing the particles of the second phosphor with a sealant. The sealant is not particularly limited as long as it can transmit visible light, but is preferably at least one of an organic material or an inorganic material, especially a transparent organic material or a transparent inorganic material. For example, at least one of a silicone resin or an epoxy resin can be used as the sealant of the organic material. For example, low-melting glass can be used as the sealant of the inorganic material.

The second phosphor is a phosphor that emits fluorescence (second fluorescence) due to a parity-allowed transition. That is, since the light emission of the second phosphor is caused by a parity-allowed transition, the absorptivity of excitation light tends to be high. As such a second phosphor, a phosphor containing at least one selected from the group consisting of $Ce^{3+}$, $Eu^{2+}$, and $Yb^{2+}$ as an activator can be used. The host of the second phosphor is not particularly limited, and at least one selected from the group consisting of an oxide, a sulfide, a nitride, a halide, an oxysulfide, an oxynitride, and an oxyhalide can be used, for example.

To describe in more detail, the activator for the second phosphor is a fluorescent ion that has a property of absorbing excitation light (primary light) emitted from a solid-state light source and converting it into optical components having a longer wavelength than that of the excitation light. The activator for the second phosphor is an ion capable of emitting fluorescence due to a parity-allowed transition and is preferably at least one selected from the group consisting of $Ce^{3+}$, $Eu^{2+}$, and $Yb^{2+}$, for example.

Examples of the second phosphor include halophosphates, phosphates, halosilicates, silicates, aluminates, aluminosilicates, borates, germanates, silicate nitrides, aluminosilicate nitrides, silicate oxynitrides, and aluminosilicate oxynitrides, to which an activator described above is added. Thus, as the second phosphor, a suitable phosphor for lighting design may be appropriately selected and used from these.

Note that a particularly preferred phosphor as the second phosphor is a composite oxide phosphor having a garnet-type crystal structure and activated with $Ce^{3+}$. Such a $Ce^{3+}$ activated garnet phosphor is preferably at least one selected from the group consisting of $Lu_3Al_2(AlO_4)_3:Ce^{3+}$, $Y_3Al_2(AlO_4)_3:Ce^{3+}$, $Lu_3Ga_2(AlO_4)_3:Ce^{3+}$, and $Y_3Ga_2(AlO_4)_3:Ce^{3+}$. The $Ce^{3+}$ activated garnet phosphor may be a solid solution having a phosphor described above as an end component.

Many $Ce^{3+}$ activated garnet phosphors have a property of absorbing blue light and converting it into yellow to green light. As described above, many $Cr^{3+}$ activated garnet phosphors have a property of absorbing blue light or red light and converting it into deep red to near infrared light. Thus, by using a solid-state light source that emits blue light, a $Cr^{3+}$ activated garnet phosphor as the first phosphor, and a $Ce^{3+}$ activated garnet phosphor as the second phosphor, output light can be obtained containing optical components that constitute the three primary colors of light and containing a near-infrared optical component.

In the wavelength converter 10, the second phosphor is preferably a phosphor that contains Ce as the light emission center element and has a light emission peak within a wavelength range of 500 nm or more and less than 600 nm. Such a second phosphor can absorb excitation light and emit green to yellow to orange fluorescence. Thus, by combining a solid-state light source that emits blue excitation light with the wavelength converter 10 including the second phosphor, white light generated through additive mixture of blue excitation light and fluorescence can be emitted. The white light can be used as illumination light.

In the wavelength converter 10, it is also preferable that the phosphor part 12 further contain, in addition to the second phosphor, a third phosphor having a light emission peak within a wavelength range of 600 nm or more and less than 700 nm. That is, the phosphor part 12 is preferably a sealed body formed by sealing both the particles of the second phosphor and the particles of the third phosphor with a sealant. Such a third phosphor can absorb excitation light and emit red fluorescence.

Here, as described above, when the second phosphor is a phosphor having a light emission peak within a wavelength range of 500 nm or more and less than 600 nm, white light can be emitted by combining a solid-state light source emitting blue excitation light with the second phosphor. In addition, when the phosphor part 12 contains the third phosphor in addition to the second phosphor, red light is further mixed with the white light through additive mixture, and thus it becomes possible to enhance color rendering properties of the white light.

The third phosphor is not particularly limited as long as it has a light emission peak within a wavelength range of 600 nm or more and less than 700 nm, and for example, a phosphor made from a nitride or oxynitride activated with $Eu^{2+}$ can be used. Examples of such an $Eu^{2+}$ activated nitride-based phosphor include phosphors of alkaline earth metal nitride silicate, alkaline earth metal nitride aluminosilicate, alkaline earth metal oxynitride silicate, and alkaline earth metal oxynitride aluminosilicate. Examples of the $Eu^{2+}$ activated nitride-based phosphor include $MAlSiN_3:Eu^{2+}$, $MAlSi_4N_7:Eu^{2+}$, and $M_2Si_5N_8:Eu^{2+}$. Note that M is constituted by at least one element selected from the group consisting of Ca, Sr, and Ba. Furthermore, an example of the $Eu^{2+}$ activated nitride-based phosphor is a phosphor in which part of an $Si^{4+}$—$N^{3+}$ combination in the composition of a compound mentioned above is replaced with $Al^{3+}$—$O^{2-}$.

Figure 7:
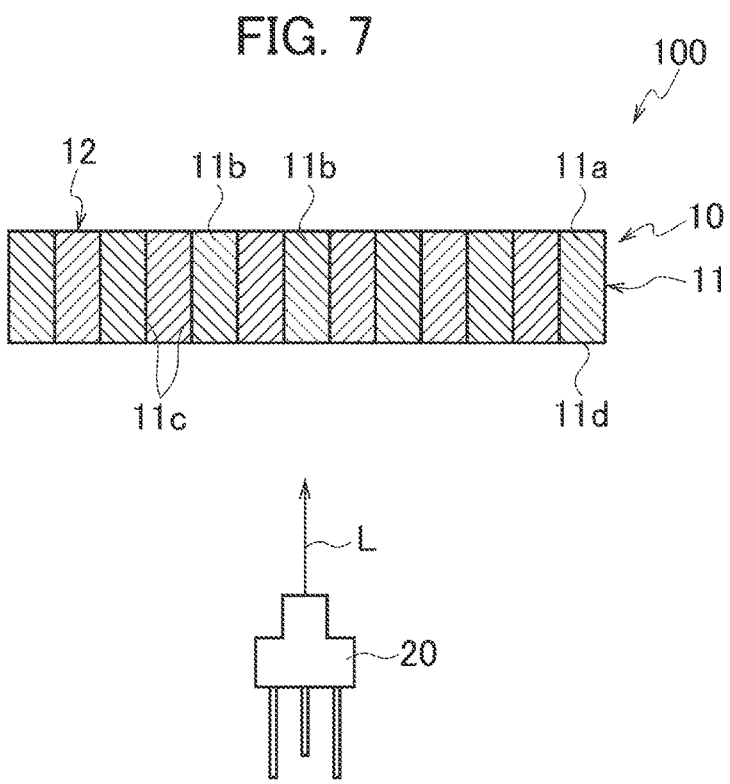
FIG. 7 is a schematic diagram illustrating an example of a light emitting device provided with a wavelength converter according to the present embodiment.

The action of the wavelength converter 10 having a configuration described above will be described. The light emitting device using the wavelength converter 10 can be configured to emit output light in a direction such that primary light L (excitation light) emitted from a solid-state light source 20 passes through the wavelength converter 10, as illustrated in FIG. 7. Specifically, primary light L emitted on the main surface 11*d* (lower surface) of the wavelength converter 10 passes through the wavelength converter 10. When the primary light L passes through the wavelength converter 10, the first phosphor contained in the phosphor ceramic 11 absorbs at least part of the primary light L and converts it into first fluorescence. Then, the first fluorescence is emitted upward from the main surface 11*a* at the upper end of the phosphor ceramic 11. Similarly, when the primary light L passes through the wavelength converter 10, the second phosphor contained in the phosphor part 12 absorbs at least part of the primary light L and converts it into second fluorescence. Then, the second fluorescence is emitted upward from the upper surface of the phosphor part 12. After that, the output light in which the first fluorescence and the second fluorescence are mixed is emitted from the light emitting surface of the light emitting device.

Here, as described above, the first phosphor contained in the phosphor ceramic 11 is a phosphor that emits fluorescence due to a parity-forbidden transition. Hence, the first phosphor cannot efficiently absorb the primary light L emitted from the solid-state light source 20, and thus the phosphor ceramic 11 needs to contain a large amount of the first phosphor. However, the phosphor ceramic 11 is a sintered body containing the first phosphor and thus has a high filling ratio of the first phosphor. Hence, the phosphor ceramic 11 as a whole can efficiently absorb the primary light L and convert the wavelength thereof to that of the first fluorescence. By adjusting the thickness t of the phosphor ceramic 11, the conversion efficiency from the primary light L to the first fluorescence can be optimized.

In contrast, the phosphor part 12 contained in the phosphor ceramic 11 is a phosphor that emits fluorescence due to a parity-allowed transition. Hence, the second phosphor can efficiently absorb the primary light L emitted from the solid-state light source, and thus the phosphor part 12 does not need to contain a large amount of the second phosphor. As described above, the phosphor part 12 is preferably a sealed body formed by sealing the particles of the second phosphor with a sealant. Therefore, by adjusting the amount of the second phosphor dispersed in the phosphor part 12, the conversion efficiency from the primary light L to the second fluorescence can be optimized. Also, by adjusting the thickness of the phosphor part 12 filled in the concave parts 11c of the phosphor ceramic 11, that is, the thickness in the y-axis direction in FIG. 3, the conversion efficiency from the primary light L to the second fluorescence can be optimized.

As described above, the phosphor ceramic 11 has a concave-convex structure including multiple convex parts 11b and multiple concave parts 11c. That is, the inside of the phosphor ceramic 11 is finely separated by multiple concave parts 11c. More specifically, as illustrated in FIG. 3, multiple concave parts 11c are formed by performing notching in the z-axis direction, and thus the inside of the phosphor ceramic 11 is separated by the concave parts 11c. Hence, the first fluorescence wavelength-converted in the phosphor ceramic 11 is unlikely to be guided along the x-axis in FIG. 3, and thus the first fluorescence is unlikely to exit from a side surface lie of the phosphor ceramic 11. Similarly, the second fluorescence wavelength-converted in the phosphor part 12 is also unlikely to be guided along the x-axis, and thus the second fluorescence is unlikely to exit from the side surface 11e of the phosphor ceramic 11. Consequently, it becomes easy for the first fluorescence and the second fluorescence to exit from the main surface 11a (top surface) of the phosphor ceramic 11, and this makes it possible to enhance the efficiency of extracting the fluorescence from the wavelength converter 10.

Here, the first phosphor contained in the phosphor ceramic 11 may generate heat due to energy loss caused by the wavelength conversion from excitation light to the first fluorescence. However, since the entire phosphor ceramic 11 is made from an inorganic material, it has high thermal conductivity. Therefore, even when the first phosphor generates heat, the heat can be radiated to the outside through the phosphor ceramic 11, and consequently, the temperature quenching of the first phosphor can be suppressed.

As in the first phosphor, the second phosphor may generate heat due to energy loss caused by the wavelength conversion from excitation light to the second fluorescence. However, since the phosphor part 12 containing the second phosphor is arranged inside the concave parts 11c of the phosphor ceramic 11, the phosphor part 12 is in direct contact with the phosphor ceramic 11. In addition, the phosphor part 12 is sandwiched between adjacent convex parts 11b. Furthermore, since the phosphor ceramic 11 is made from an inorganic material, it has high thermal conductivity. Therefore, even when the second phosphor generates heat, heat can be radiated to the outside through the sealant of the phosphor part 12 and the phosphor ceramic 11, and consequently, the temperature quenching of the second phosphor can be suppressed.

As illustrated in FIG. 4, a wavelength converter 10A according to the present embodiment may have a bottom wall part 11f on the other main surface 11d of the phosphor ceramic 11. The bottom wall part 11f, as with the convex parts 11b, is a plate member made from a sintered body containing the first phosphor, and is formed over the entire main surface 11d. The convex parts 11b and the bottom wall part 11f are formed as one body, and the convex parts 11b and the bottom wall part 11f form the concave parts 11c. That is, as described below, in a phosphor ceramic 11A, the concave parts 11c are formed by first making an approximately rectangular parallelepiped (plate-like) sintered body containing the first phosphor and then by notching the surface of the sintered body using dicing or the like. Thus, in the phosphor ceramic 11A, the convex parts 11b and the bottom wall part 11f are formed as one body.

Then, as illustrated in FIG. 4, by filling the concave parts 11 of the phosphor ceramic 11A with the phosphor part 12, the wavelength converter 10A can be obtained. Even in such a wavelength converter 10A, by emitting the primary light L from the lower surface, the primary light L passes through the bottom wall part 11f and reaches the convex parts 11b of the phosphor ceramic 11 and the phosphor part 12. Then, the first phosphor absorbs at least part of the primary light L and converts it into first fluorescence, and emits the first fluorescence upward from the main surface 11a. Similarly, the second phosphor absorbs at least part of the primary light L and converts it into second fluorescence, and emits the second fluorescence upward from the upper surface of the phosphor part 12.

As illustrated in FIG. 3, when viewed in plan view, the wavelength converter according to the present embodiment can be a stripe type in which the phosphor ceramic 11 and the phosphor part 12 are alternately stacked. However, the wavelength converter according to the present embodiment is not limited to such a shape. For example, as illustrated in (a) and (b) of FIG. 5, when viewed in plan view, the wavelength converter may be a dot type in which the phosphor part 12 is dispersed in a matrix of the phosphor ceramic 11. As illustrated in (c) and (d) of FIG. 5, when viewed in plan view, the wavelength converter may be a dot type in which the phosphor ceramic 11 is dispersed in a matrix of the phosphor part 12.

Here, FIG. 5(a) is a plan view illustrating a configuration in which the phosphor part 12 is dispersed in the matrix of the phosphor ceramic 11 when viewed in plan view. FIG. 5(b) is a cross-sectional view along the B-B line in FIG. 5(a). FIG. 5(c) is a plan view illustrating a configuration in which the phosphor ceramic 11 is dispersed in the matrix of the phosphor part 12 when viewed in plan view. FIG. 5(d) is a cross-sectional view along the D-D line in FIG. 5(c).

Figure 5:
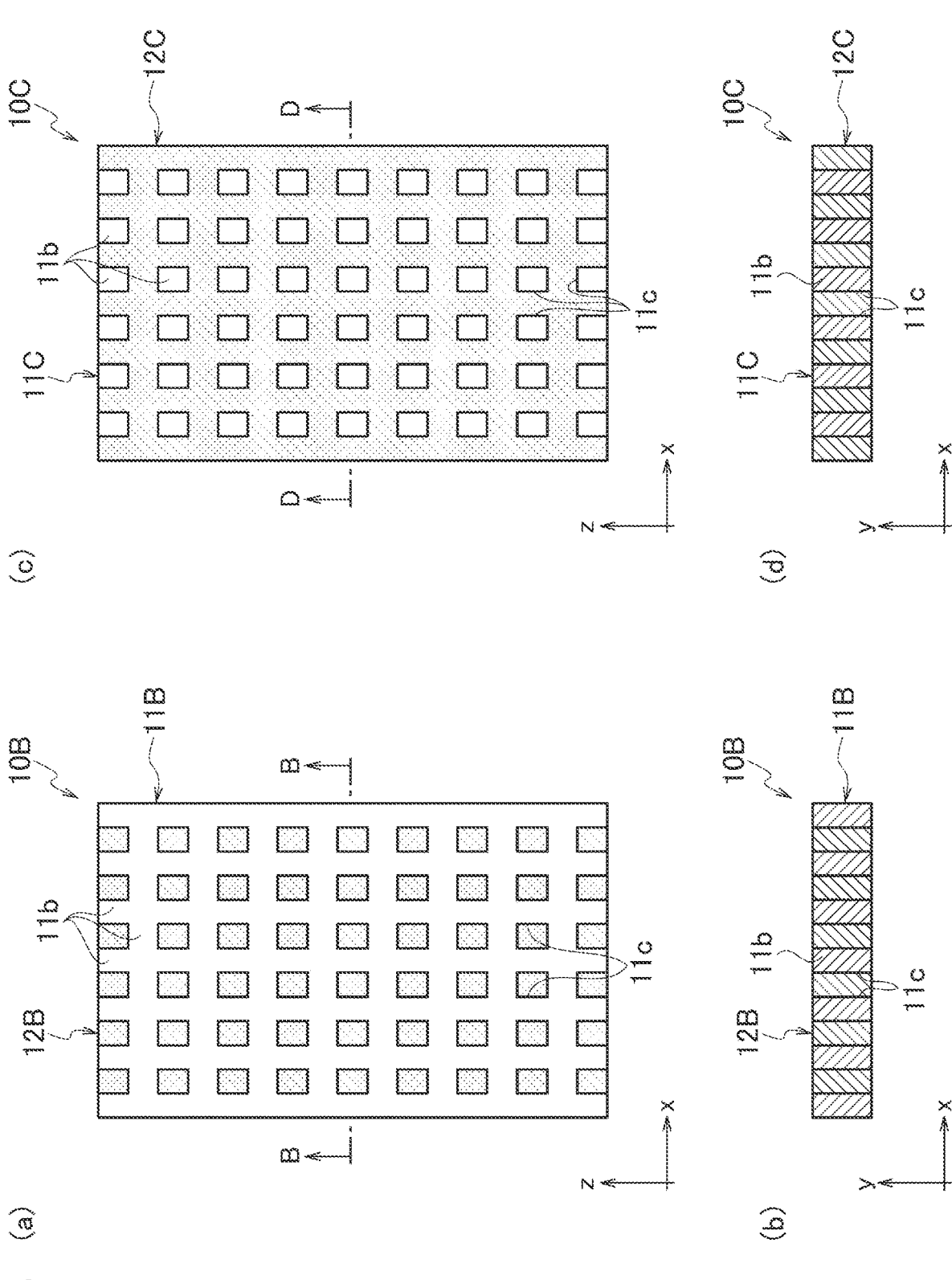
FIG. 5 includes diagrams schematically illustrating other examples of the wavelength converter according to the present embodiment.

As illustrated in (a) and (b) in FIG. 5, a wavelength converter 10B has a configuration in which multiple phosphor parts 12B are dispersed in a lattice matrix of a phosphor ceramic 11B. In this case, since the proportion of the phosphor ceramic 11B is higher than that of the phosphor part 12B, the wavelength converter 10B can emit output light containing a large amount of the first fluorescence. In addition, the phosphor part 12B is surrounded by the phosphor ceramic 11B. Thus even if the second phosphor generates heat, the heat can be efficiently radiated through the phosphor ceramic 11B, and temperature quenching of the second phosphor can be suppressed. As illustrated in (c) and (d) in FIG. 5, a wavelength converter 10C has a configuration in which multiple pieces of phosphor ceramic 11C are dispersed in a lattice matrix of the phosphor part 12C. In this case, since the proportion of the phosphor part 12C is higher than that of the phosphor ceramic 11C, the wavelength converter 10C can emit output light containing a large amount of the second fluorescence.

Here, with the phosphor part 12 not arranged inside the concave parts 11*c* in the phosphor ceramic 11, it is preferable that an average length PSm of a profile curve element in the concave convex structure be 400 μm or less. That is, with respect to surface properties of the main surface 11*a* of the phosphor ceramic 11 itself, it is preferable that the average length PSm of a profile curve element specified in Japanese Industrial Standards JIS B0601 be 400 μm or less. When the average length PSm of the profile curve element is 400 μm or less, the period of the convex part 11*b* and the concave part 11*c* becomes smaller, and thus it is possible to enhance the heat dissipation property of the convex parts 11*b* and to suppress the temperature quenching more. In addition, since the first fluorescence is emitted from the upper surface of the convex parts 11*b* and the second fluorescence is emitted from the upper surface of the phosphor part 12 as described above, unevenness in the light emission of fluorescence can be suppressed by keeping the average length PSm within the above range and making the period structure of the convex parts 11*b* finer.

Note that regarding the phosphor ceramic 11, the average length PSm of the profile curve element in the concave-convex structure is more preferably 350 μm or less, even more preferably 300 μm or less, especially preferably 250 μm or less. The lower limit of the average length PSm is not particularly limited and can be 50 μm, for example.

The wavelength converter according to the present embodiment may be fixed by arranging it on the surface of a substrate, as in the wavelength converter illustrated in FIGS. 1 and 2. With such a configuration, durability and impact resistance of the wavelength converter can be enhanced.

As the substrate on which a wavelength converter is arranged, one having a property of transmitting excitation light emitted from a solid-state light source and fluorescence emitted from first and second phosphors can be used. That is, the substrate can be made to have translucency. Such a substrate is not particularly limited, and for example, a substrate made from quartz, sapphire, or translucent fluorescent ceramic can be used. As the substrate on which a wavelength converter is arranged, one having a property of reflecting excitation light emitted from a solid-state light source and fluorescence emitted from first and second phosphors can be used. That is, the substrate can be made to have light reflectivity. Such a substrate is not particularly limited, and for example, a substrate made from a metal can be used, specifically, a substrate made from aluminum.

Figure 6:
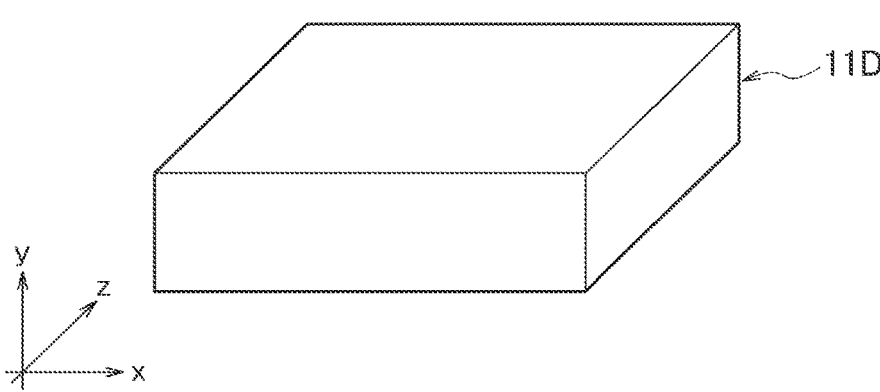
FIG. 6 includes schematic perspective views for illustrating a method of manufacturing a wavelength converter according to the present embodiment.
Figure 6:
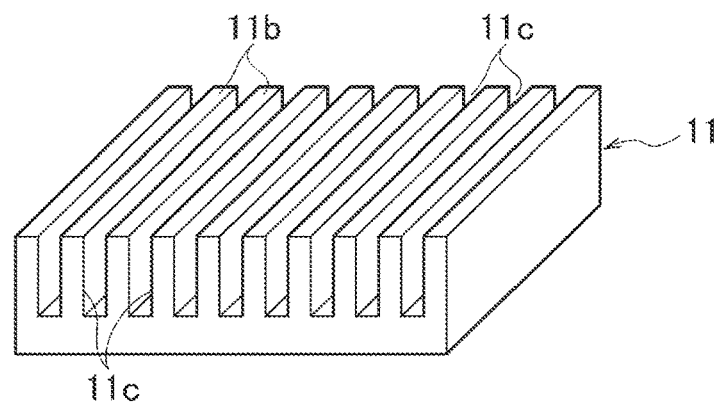
Figure 6:
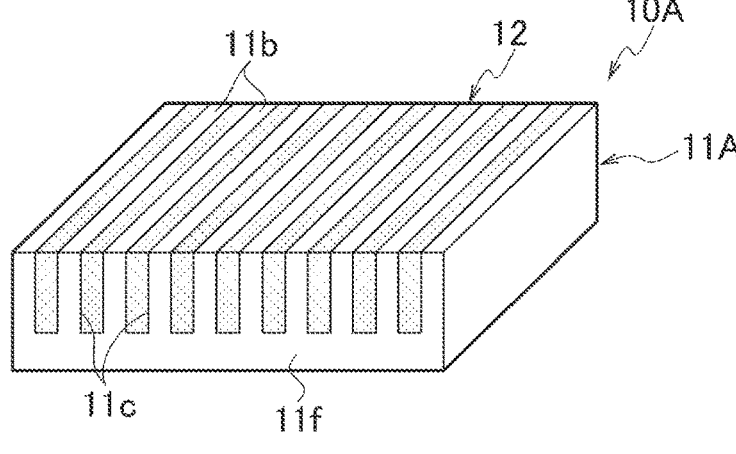
Figure 6:
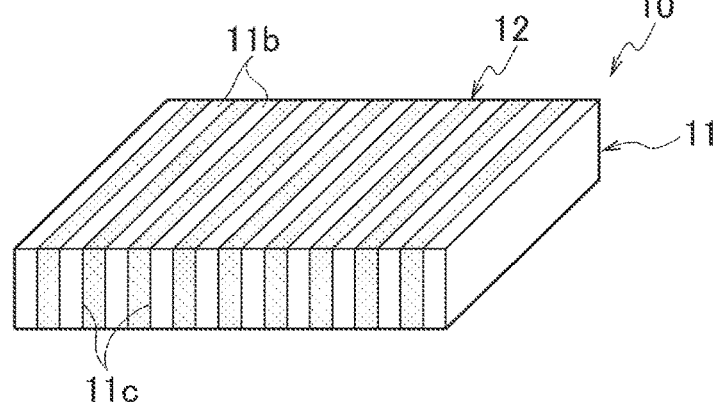

Next, a method of manufacturing the wavelength converter according to the present embodiment will be described. As illustrated in FIG. 6(*a*), first, a sintered body 11D having an approximately rectangular parallelepiped (plate-like) shape containing a first phosphor is manufactured. The sintered body 11D can be obtained by pressing a powder of the first phosphor into a compact and then calcining the compact. The sintered body 11D can be obtained by pressing a powder of a raw material for synthesizing the first phosphor into a compact and then calcining the compact.

Then, as illustrated in FIG. 6(*b*), concave parts 11*c* are formed by performing notching from the main surface of the sintered body 11D. The method of forming the concave parts 11*c* is not particularly limited and can be performed using a dicing saw, for example. The concave parts 11*c* may be formed in the sintered body 11D using a drill or the like. By forming the concave parts 11*c* in this way, the phosphor ceramic 11 can be obtained.

Note that when forming the concave parts 11 through dicing, it is not necessary to cut the sintered body 11D from one main surface to the other main surface of the sintered body 11D. That is, as illustrated in FIG. 6(*b*), the concave parts 11*c* can be formed by cutting to the middle of the other main surface of the sintered body 11D.

Next, as illustrated in FIG. 6(*c*), the concave parts 11*c* of the obtained phosphor ceramic 11 is filled with a sealant in which the second phosphor is dispersed. Then, a wavelength converter can be obtained by polishing the main surfaces and side surfaces of the phosphor ceramic 11 as necessary. Note that the wavelength converter 10A in FIG. 6(*c*) has the bottom wall part 11*f*. Thus, by polishing and removing the bottom wall part 11*f* as illustrated in FIG. 6(*d*), the wavelength converter 10 illustrated in FIG. 3 can be obtained.

In this way, the wavelength converter 10 according to the present embodiment includes the phosphor ceramic 11 containing the first phosphor that emits fluorescence due to a parity-forbidden transition and includes the phosphor part 12 containing the second phosphor that emits fluorescence due to a parity-allowed transition. The main surface 11*a* of the phosphor ceramic 11 has a concave-convex structure constituted by multiple convex parts 11*b* and multiple concave parts 11*c*. In addition, the phosphor part 12 is arranged inside the multiple concave parts 11*c* in the phosphor ceramic 11.

In the wavelength converter 10, the phosphor ceramic 11 is a sintered body containing the first phosphor and thus has a high filling ratio of the first phosphor. Hence, the phosphor ceramic 11 as a whole can efficiently absorb excitation light and convert the wavelength thereof. By adjusting the thickness t of the phosphor ceramic 11, the conversion efficiency from the excitation light to the first fluorescence can be optimized. Since the second phosphor is dispersed in the phosphor part 12, the conversion efficiency from the excitation light to the second fluorescence can be optimized by adjusting the amount of second phosphor and the thickness of the phosphor part 12.

Furthermore, since the inside of the phosphor ceramic 11 is separated by the concave parts 11*c*, the first fluorescence and the second fluorescence are easily emitted from the main surface 11*a* of the phosphor ceramic 11. Thus, the efficiency of extracting the fluorescence from the wavelength converter 10 can be enhanced. Furthermore, since the phosphor ceramic 11 is made from an inorganic material, it is possible to promote the heat dissipation from the first phosphor and the second phosphor and to suppress the temperature quenching thereof. In this way, the wavelength converter 10 according to the present embodiment can enhance the light emission efficiency of the phosphors without using a rotary driving device.

When the wavelength converter 10 is viewed in plan view, the phosphor ceramic 11 and the phosphor part 12 are preferably stacked alternately. Furthermore, when the wavelength converter 10 is viewed in plan view, it is also preferable that the phosphor part 12 be arranged in a separated manner with the phosphor ceramic 11 therebetween or that the phosphor ceramic 11 be arranged in a separated manner with the phosphor part 12 therebetween. With such a configuration, the first fluorescence is directly emitted from the part of the phosphor ceramic 11 on the light emitting surface (main surface 11a) of the wavelength converter 10, and the second fluorescence is directly emitted from the part of the phosphor part 12 on the light emitting surface. Thus, it becomes possible to enhance the efficiency of extracting the first fluorescence and second fluorescence from the wavelength converter 10.

Furthermore, in the wavelength converter 10, the thermal conductivity of the phosphor ceramic 11 is preferably larger than that of the phosphor part 12. As described above, the phosphor part 12 is arranged in the concave parts 11 of the phosphor ceramic 11. Thus, by making the thermal conductivity of the phosphor ceramic 11 higher than that of the phosphor part 12, it is possible to promote the heat dissipation of the first phosphor and second phosphor and suppress the temperature quenching thereof.

[Light Emitting Device]

Next, a light emitting device according to the present embodiment will be described. As illustrated in FIG. 7, a light emitting device 100 according to the present embodiment includes the wavelength converter 10 described above and the solid-state light source 20 that emits light (excitation light, primary light L) with which the wavelength converter 10 is irradiated. As such a solid-state light source 20, a solid-state light emitting element that emits primary light L having a light emission peak within a wavelength range of 400 nm or more and less than 500 nm, preferably 440 nm or more and less than 480 nm, can be used.

A light emitting diode (LED) or a laser diode can be used as the solid-state light source 20, for example. By using, for example, an LED module or laser diode emitting high energy light of 1 W or more, a light emitting device can be expected to have a light output of a several hundred mW class. In addition, by using, for example, an LED module emitting high energy light of 3 W or more or 10 W or more, a light emitting device can be expected to have a light output of a several W class. Furthermore, by using, for example, an LED module emitting high energy light of 30 W or more, a light emitting device can be expected to have a light output of more than 10 W. Furthermore, by using, for example, an LED module emitting high energy light of 100 W or more, a light emitting device can be expected to have a light output of more than 30 W.

When a laser diode is used as the solid-state light source 20 and laser light is set as primary light, the specification is such that the wavelength converter 10 is irradiated with a high-density spot light. Thus, the obtained light emitting device can be a high-output point light source, and this makes it possible to expand the range of industrial applications of solid-state lighting. Examples of such a laser diode used include an edge emitting laser (EEL) and a vertical cavity surface emitting laser (VCSEL).

A light guiding member such as an optical fiber may be interposed between the wavelength converter 10 and the solid-state light source 20. This allows the wavelength converter 10 and the solid-state light source 20 to be spatially separated in the structure. Thus, the light emitting part is light and can be freely moved, resulting in a light emitting device that can easily change the irradiation place freely.

As described above, in the light emitting device, the solid-state light source 20 is preferably at least one of a light emitting diode or a laser diode. However, the solid-state light source 20 is not limited to these, and any light emitting device can be used as long as it is capable of emitting high output primary light.

Note that the number of solid-state light sources 20 provided in the light emitting device is not particularly limited, and there may be a single solid-state light source 20 or there may be multiple solid-state light sources 20. When there are multiple solid-state light sources 20, the output of the primary light can be easily increased, and this makes the light emitting device advantageous for increasing the output.

The number of solid-state light sources 20 is not particularly limited and may be appropriately selected from, for example, 9 or more, 16 or more, 25 or more, 36 or more, 49 or more, 64 or more, 81 or more, and 100 or more. The upper limit of the number is not particularly limited and may be appropriately selected from, for example, 9 or less, 16 or less, 25 or less, 36 or less, 49 or less, 64 or less, 81 or less, and 100 or less.

In the light emitting device, the solid-state light source 20 is preferably a surface emitting light source of a surface emitting type. This suppresses variation in intensity distribution and unevenness in color tone of the primary light emitted on the wavelength converter 10, and thus the light emitting device is made advantageous in suppressing unevenness in the intensity distribution of the output light.

In the light emitting device 100 illustrated in FIG. 7, the primary light emitted by the solid-state light source 20 is directly emitted on the phosphor ceramic 11 and the phosphor part 12 in the wavelength converter 10. That is, at least part of the primary light L emitted on the lower surface of the wavelength converter 10 is absorbed by the first phosphor contained in the phosphor ceramic 11 and the second phosphor contained in the phosphor part 12. The first phosphor converts the primary light L into first fluorescence, and the second phosphor converts the primary light L into second fluorescence. Then, the first fluorescence is emitted upward from the main surface 11a at the upper end of the phosphor ceramic 11, and the second fluorescence is emitted upward from the upper surface of the phosphor part 12. Thereafter, output light of a mixture of the first fluorescence and the second fluorescence is emitted from the light emitting surface of the light emitting device. Note that the output light may contain primary light L transmitted through the wavelength converter 10 in addition to the first fluorescence and the second fluorescence.

Figure 8:
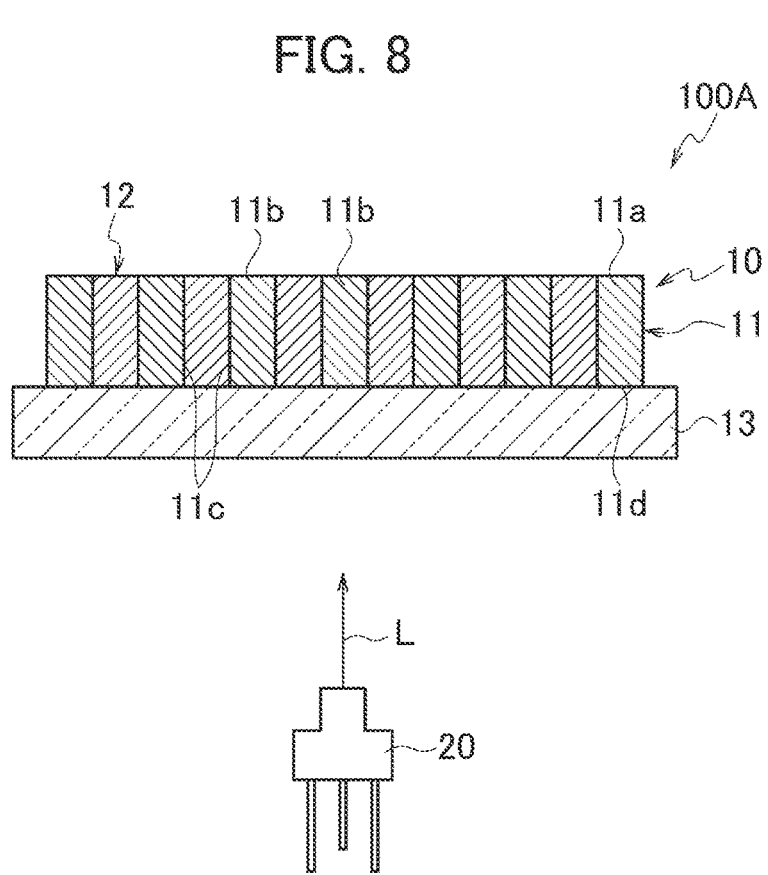
FIG. 8 is a schematic diagram illustrating another example of the light emitting device provided with the wavelength converter according to the present embodiment.

As described above, the wavelength converter 10 may be fixed by arranging it on the surface of a substrate. FIG. 8 illustrates a light emitting device 100A in which the wavelength converter 10 is fixed by a substrate 13 having translucency. In such a light emitting device 100A, primary light L emitted from below toward the substrate 13 passes through the substrate 13 and reaches the wavelength converter 10. Then, as described above, the primary light L is wavelength-converted by the first phosphor contained in the phosphor ceramic 11 and the second phosphor contained in the phosphor part 12. Then, output light of a mixture of the first fluorescence and the second fluorescence is emitted from the emitting surface of the light emitting device 100A. Note that the output light may contain primary light L transmitted through the substrate 13 and the wavelength converter 10 in addition to the first fluorescence and the second fluorescence.

Next, an improved example for improving the performance regarding the light emitting device according to the present embodiment will be described.

The light emitting device according to the present embodiment can increase the absolute number of photons constituting the output light by means such as making the solid-state light source 20 a high-power type or increasing the number of solid-state light sources 20. This can cause the light energy of the output light emitted from the light emitting device to exceed 3 W, preferably 10 W, more preferably 30 W. By employing a light emitting device such a high-power type, the light emitting device can irradiate with strong output light (for example, near-infrared light) and thus can irradiate an object to be irradiated with relatively strong near-infrared rays even though the distance from the object is large. In addition, even when the object to be irradiated is minute or has a thickness, the light emitting device can easily obtain information related to the object.

The light emitting device can also increase photon density supplied to a phosphor by means such as making the solid-state light source 20 be a light emitting element that emits a high-light-density primary light, such as a laser diode, or focusing the light emitted by the solid-state light source 20 using an optical lens. For example, the light energy density of the primary light emitted by the solid-state light source 20 can be made to exceed $0.3 \ W/mm^2$, preferably $1.0 \ W/mm^2$, more preferably $3.0 \ W/mm^2$. In this case, the light energy density of primary light is large, and thus the light emitting device can be made to emit relatively strong output light even with a configuration in which primary light that has been optically diffused is emitted on the wavelength converter. With a configuration in which primary light that has not been optically diffused is emitted on the wavelength converter, the light emitting device can be made to emit output light having a large light energy density. Thus, it is possible to provide a light emitting device that can emit output light over a large area while utilizing a light emitting element having a small light emitting surface, and a light emitting device that emits output light having a large light energy density. Furthermore, the light emitting device can also be made capable of point-output of near-infrared light having a large light energy density, for example. Note that the upper limit of the light energy density of the primary light emitted by a solid-state light source is not particularly limited and can be $30 \ W/mm^2$, for example.

By using the solid-state light source 20 that emits such a high-light-density primary light, the wavelength converter can be made to have an energy density of the emitted light that exceeds $0.3 \ W/mm^2$, preferably $1.0 \ W/mm^2$, more preferably $3.0 \ W/mm^2$.

Note that by selecting an appropriate solid-state light source, the intensity of optical components in the output light in a range of wavelengths shorter than 440 nm can be adjusted to be less than 3% of the fluorescence intensity maximum value. The intensity of optical components in the output light in a range of wavelengths shorter than 440 nm can also be adjusted to be less than 1% of the fluorescence intensity maximum value. In this way, output light having an intensity of optical components near zero in a wavelength range of ultraviolet to blue, to which a photoresist is sensitive, is obtained, and thus the light emitting device can be made advantageous for semiconductor related inspection work.

The light emitting device according to the present embodiment may further include a light distribution control mechanism for controlling light distribution properties. With such a configuration, the light emitting device can be made advantageous in obtaining output light having desired light distribution properties, such as in a variable light distribution type lighting system for use in vehicles.

The light emitting device according to the present embodiment may further include an output intensity variable mechanism for changing the intensity of output light, such as a control device for input power. With such a configuration, the light emitting device is made advantageous for inspection of foods and drugs that are easily damaged by near-infrared irradiation.

The light emitting device according to the present embodiment may further include a variable mechanism for changing the peak wavelength of optical components that have a fluorescence intensity maximum value within a wavelength range of 700 nm or more and less than 2500 nm, for example. With such a configuration, the light emitting device is made highly versatile and easily adaptable to various applications. Since the penetration depth of light into the inside of an object to be irradiated varies according to wavelength, the light emitting device is made also advantageous for inspection in the depth direction of an object to be irradiated. Note that as such a variable mechanism for the fluorescence peak wavelength, an optical filter such as a bandpass filter or a low-cut filter can be used, for example.

The light emitting device according to the present embodiment may further include an optical control mechanism for controlling the on and off of the output of at least part of the output light. With such a configuration, the light emitting device is made highly versatile and easily adaptable to various applications.

Note that in the light emitting device according to the present embodiment, visible optical components having a wavelength of less than 700 nm and optical components having a wavelength of 700 nm or more in the output light can be made to be pulsed light. The half width of irradiation time of pulsed light can be less than 300 ms. In addition, the half width can be made shorter as the output intensity of the output light becomes larger. Thus, according to the output intensity of the output light, the half width can be made less than 100 ms, less than 30 ms, less than 10 ms, less than 3 ms, or less than 1 ms. Note that turn off time of pulsed light can be within a range of 1 ms or more and less than 10 s.

Here, it has been reported that the human eye perceives light of 50 to 100 Hz (period 20 to 10 ms) as flicker. It has also been reported that birds such as pigeons perceive light of around 150 Hz (period 6.7 ms) as flicker, while insects such as flies perceive light of around 300 Hz (period 3.3 ms) as flicker. Thus, a turn off time of less than 30 ms at which these creatures do not sense flicker is one preferred form.

In contrast, intense light irradiation carries a risk of damaging the object irradiated, and thus for applications where flicker is not a concern, 100 ms or more, and especially 300 ms or more are preferred forms for the turn off time for pulsed light.

Note that a light energy of output light that is preferred for the purpose of adjusting the growth of human hair and body hair is within a range of $0.01 \ J/cm^2$ or more and less than 1 $J/cm^2$. When the light energy of output light emitted from the light emitting device is set in this range and the output light is emitted around hair roots, melanin present inside the skin can be made to absorb the light. As a result, the growth of hair and the like can be adjusted.

Here, the $\frac{1}{10}$ afterglow time of output light, that is, the time until light intensity just before the light is turned off decreases to $\frac{1}{10}$, is preferably less than 100 μm, more preferably less than 10 μm, particularly preferably less than 1 μm. Thus, a light emitting device capable of instantaneous lighting and instantaneous extinguishing can be obtained.

The light emitting device according to the present embodiment can further include an ultraviolet light source that emits ultraviolet light having an intensity maximum value within a wavelength range of 120 nm or more and less than 380 nm, preferably 250 nm or more and less than 370 nm. In this way, the light emitting device is made to also have a sterilizing effect using ultraviolet light.

The light emitting device according to the present embodiment is preferably a medical light emitting device. That is, the light emitting device according to the present embodiment capable of emitting a near-infrared optical component can be a medical or biotechnological light source or lighting device. In particular, the light emitting device according to the present embodiment can be a medical light emitting device used for fluorescence imaging or photodynamic therapy, or a biotechnological light emitting device used for an examination and an analysis of cells, genes, specimens, and the like. A near-infrared optical component has the property of penetrating living organisms, cells, and the like, and thus it becomes possible for such a light emitting device to observe and treat diseased areas from inside and outside the body and to use it in biotechnology.

In addition, the light emitting device according to the present embodiment capable of emitting a near-infrared optical component can be a light source for a sensing system or an illumination system for a sensing system. In this way, for example, the content or foreign matter in an organic bag or container can be inspected in an unopened state by using a near-infrared optical component having a property of penetrating organic matter, or a near-infrared optical component reflected by an object. Furthermore, such a light emitting device can monitor animals and plants including people, and objects.

[Electronic Device]

Figure 9:
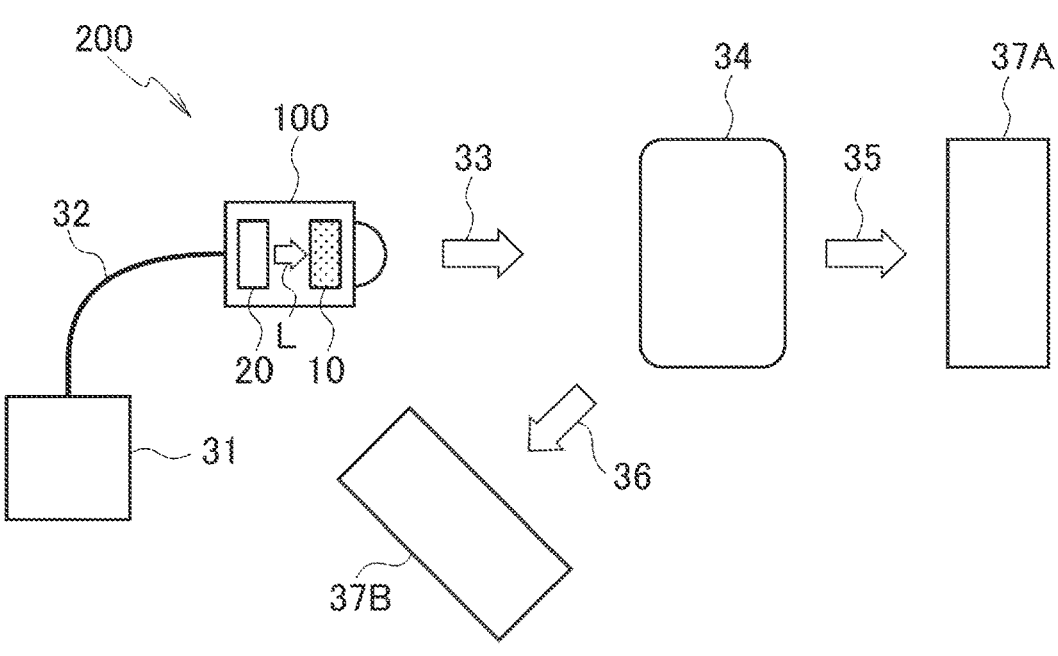
FIG. 9 is a schematic diagram illustrating an example of an electronic device provided with the light emitting device according to the present embodiment.

Next, an electronic device according to the present embodiment will be described. The electronic device according to the present embodiment includes a light emitting device described above. FIG. 9 schematically illustrates an example of the electronic device according to the present embodiment. An electronic device 200 at least includes a power supply circuit 31, a conductor 32, and a light emitting device 100 including a wavelength converter 10 and a solid-state light source 20.

The power supply circuit 31 supplies power to the solid-state light source 20 in the light emitting device 100. The power supply circuit 31 also supplies electric energy to the solid-state light source 20 through the conductor 32.

The light emitting device 100 converts electric energy into light energy as described above. The light emitting device 100 converts at least part of the electric energy supplied from the power supply circuit 31 into light energy that becomes output light 33 and outputs it. Note that the light emitting device 100 in FIG. 9 is configured to emit output light 33 including near-infrared light.

The electronic device 200 in FIG. 9 further includes a first detector 37A and a second detector 37B. The first detector 37A detects transmitted optical components 35 of the output light 33 which is emitted from the light emitting device 100 and with which an object to be irradiated 34 is irradiated. Specifically, the first detector 37A detects near-infrared light in the transmitted optical components 35 transmitted through the object to be irradiated 34. The second detector 37B detects reflected optical components 36 in the output light 33 which is emitted from the light emitting device 100 and with which the object to be irradiated 34 is irradiated. Specifically, the second detector 37B detects near-infrared light in the reflected optical components 36 reflected by the object to be irradiated 34.

In the electronic device 200 with such a configuration, the object to be irradiated 34 is irradiated with the output light 33 containing a near-infrared optical component, and transmitted optical components 35 transmitted through the object to be irradiated 34 and reflected optical components 36 reflected by the object to be irradiated 34 are detected by the first detector 37A and the second detector 37B, respectively. Therefore, it becomes possible for the electronic device 200 to detect property information, involving a near-infrared optical component, of the object to be irradiated 34.

Here, the light emitting device according to the present embodiment can emit output light 33 that includes visible light and near-infrared light, and is convenient for both the human eye and the detector. Therefore, when the light emitting device is combined with a near-infrared detector, it becomes an electronic device suitable for industrial applications.

In addition, the light emitting device according to the present embodiment can be configured to irradiate a wide area with a large energy of the output light 33. Thus, even when the object to be irradiated 34 is irradiated with the output light 33 from a distance, a signal having a good S/N ratio (signal to noise ratio) can be detected. Therefore, an electronic device is made suitable for inspection of a large object to be irradiated 34, batch inspection of widely distributed objects, detection of objects present in part of a wide inspection area, and detection of people and objects from a distance.

For reference, to describe the size of the light emitting device according to the present embodiment, the area of the main light extraction surface of the light emitting device 100 can be within a range of 1 cm$^2$ or more and less than 1 m$^2$, preferably 10 cm$^2$ or more and less than 1000 cm$^2$, for example. The shortest distance from the light emitting device 100 to the object to be irradiated 34 is, for example, within a range of 1 mm or more and less than 10 m. When it is necessary to irradiate the object to be irradiated 34 with strong near-infrared rays, for example, in a medical, cosmetic, or delicate foreign matter examination, the shortest distance from the light emitting device 100 to the object to be irradiated 34 can be within a range of 1 mm or more and less than 30 cm, preferably 3 mm or more and less than 10 cm, for example. When it is necessary to inspect the object to be irradiated 34 over a wide area, the shortest distance from the light emitting device 100 to the object to be irradiated 34 can be within a range of 30 cm or more and less than 10 m, preferably 1 m or more and less than 5 m.

Note that when it is necessary to irradiate a wide area with strong near-infrared rays, it is preferable to have a configuration in which the light emitting device 100 is movable, and it is more preferable to have a configuration in which the light emitting device 100 can move freely depending on the shape of an object to be irradiated. For example, the light emitting device 100 can have a structure capable of coming and going on a straight line or a curved line, a structure capable of scanning in XY axes or XYZ directions, and a structure attached to a moving object (cars, bicycles, and flying vehicles, such as drones).

The first detector 37A and the second detector 37B can use a variety of photodetectors. Specifically, a quantum-type photodetector (photodiode, phototransistor, photo IC, CCD image sensor, CMOS image sensor, and the like) that detects a charge generated when light enters the PN junction of a semiconductor can be used. The photodetector can also be a heat-type photodetector (thermopile using thermoelectric effect, pyroelectric element using pyroelectric effect, and the like) that detects a change in electrical properties caused by a temperature rise due to heat generated when light is received, or an infrared film that is sensitive to light.

As the first detector 37A and the second detector 37B, a single element utilizing a photoelectric conversion element alone may be used, or an imaging element integrating photoelectric conversion elements may be used. The form of the imaging element may be linear with a one-dimensional arrangement or planar with a two-dimensional arrangement. An imaging camera can also be used as the first detector 37A and the second detector 37B.

Note that although the electronic device 200 in FIG. 9 has both the first detector 37A and the second detector 37B, the electronic device only needs to have at least one of the first detector 37A or the second detector 37B.

The electronic device according to the present embodiment can be used as an inspection device, a detection device, a monitoring device, or a sorting device for an object to be irradiated, using output light. The near-infrared optical component of the output light has the property of passing through most materials. Thus, by adopting a configuration for irradiating a material with near-infrared light from outside and to detect transmitted or reflected light, the internal condition and the presence or absence of foreign matter can be inspected without destroying the material.

In addition, the near-infrared optical component is invisible to the human eye, and its reflection properties depend on materials. Thus, by adopting a configuration to irradiate an object with near-infrared light and to detect the reflected light, people, animals, plants, and objects can be inspected even in the dark without being perceived by humans.

Furthermore, the electronic device according to the present embodiment can inspect the internal condition of a material and the presence or absence of foreign matter therein without destroying the material, determine the quality of the material, and select between good and defective products. Thus, by further providing the electronic device with a mechanism to sort an object to be irradiated in a normal state from an object to be irradiated in an abnormal state, it becomes possible to sort objects.

In the electronic device according to the present embodiment, the light emitting device 1 is not a movable type and can be a fixed type. Here, it is not necessary to have a complicated mechanism to operate a light emitting device mechanically, and thus the electronic device is unlikely to fail. By fixing a light emitting device indoors or outdoors, it is possible in a predetermined place to observe the state of people and objects at a fixed point and to count the number of people and objects. Thus, the electronic device is made advantageous for collecting big data useful for discovery of problems and useful for business utilization.

In the electronic device according to the present embodiment, the light emitting device 1 can be also a movable type to change the irradiation place. For example, the light emitting device 1 can be a movable type by mounting it on a moving stage or a moving body (vehicle, flying object, and the like). In this way, the light emitting device 1 can irradiate a desired area and a wide area, and thus the electronic device is made advantageous for inspecting a large object and for inspecting the condition of an object outdoors.

In addition to the light emitting device, the electronic device according to the present embodiment can be configured to include a hyperspectral camera as an imaging camera. Thus, the electronic device can perform hyperspectral imaging. An electronic device provided with a hyperspectral camera can distinguish differences that cannot be distinguished with the naked eye or a regular camera as images, making it a useful inspection device in a wide range of fields related to product inspection, product selection, and the like.

Figure 10:
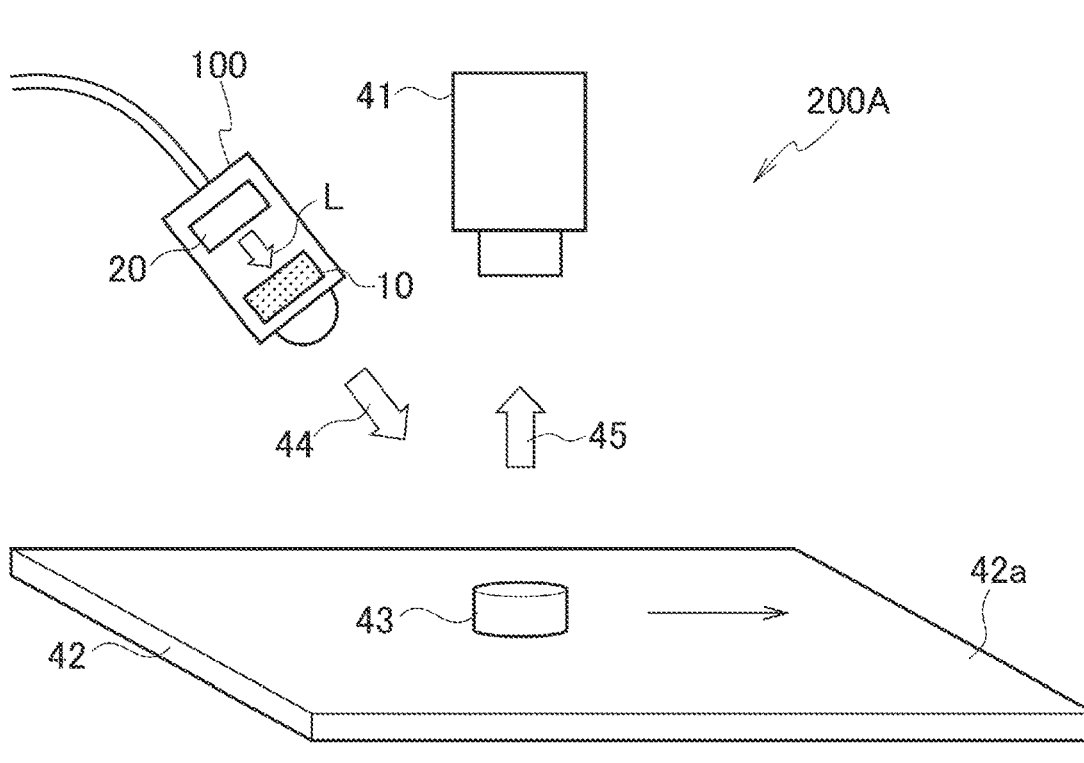
FIG. 10 is a schematic diagram illustrating another example of the electronic device provided with the light emitting device according to the present embodiment.

Specifically, as illustrated in FIG. 10, an electronic device 200A includes the light emitting device 100 and a hyperspectral camera 41. The light emitting device 100 irradiates an object to be irradiated 43 placed on a surface 42a of a conveyor 42 with output light 44 while the hyperspectral camera 41 takes an image of reflected light 45 from the object to be irradiated 43. By analyzing the obtained image of the object to be irradiated 43, inspection and selection of the object to be irradiated 43 can be performed.

In addition to the light emitting device, the electronic device according to the present embodiment also preferably includes a data processing system for machine learning. This makes it possible to iteratively learn the data captured into the computer and find and underlying pattern. It also becomes possible to apply newly captured data to the pattern. Thus, the electronic device is made advantageous for automating and increasing precision in inspection, detection, and monitoring, and even for predicting the future using big data.

The electronic device according to the present embodiment can be used for medical, veterinary, biotechnological, agricultural, forestry and fisheries, animal husbandry (meat, meat products, dairy products, and the like), and industrial (foreign matter inspection, content inspection, shape inspection, packaging condition inspection, and the like) applications. The electronic device can also be used for inspection of pharmaceuticals, animal experiments, food, beverages, agricultural, forestry and fisheries products, livestock products, and industrial products. In other words, the electronic device according to the present embodiment can be used for any of human body, animal and plant, and object, and can also be used for any of gas, liquid, and solid.

The electronic device according to the present embodiment is preferably used as a medical device, a therapeutic device, a beauty device, a health device, a care related device, an analytical device, a measuring device, or an evaluation device.

For example, for the purpose of medical and biotechnology development, the electronic device according to the present embodiment can be used for examination, detection, measurement, evaluation, assay, analysis, observation, monitoring, separation, diagnosis, treatment, purification, and the like of 1) blood, body fluid, and their components, 2) excreta (urine and feces), 3) proteins and amino acids, 4) cells (including cancer cells), 5) genes, chromosomes, and nucleic acids, 6) biological samples, bacteria, specimens, and antibodies, 7) biological tissues, organs, and blood vessels, and 8) skin diseases and alopecia.

For example, for the purpose of beauty and health care, the electronic device according to the present embodiment can be used for examination, detection, measurement, evaluation, assay, analysis, observation, monitoring, beautification, hygiene, growth promotion, health promotion, diagnosis, and the like of 1) skin, 2) hair and body hair, 3) oral, endodontic, and periodontal conditions, 4) ear and nose, and 5) vital signs.

For example, for the purposes of agriculture, forestry and fisheries industry, animal husbandry, and industry, the electronic device according to the present embodiment can be used for the inspection, detection, measurement, quantification, evaluation, assay, analysis, observation, monitoring, recognition, selection, sorting, and the like of 1) industrial products (including electronic components and electronic devices), 2) agricultural products (fruits and vegetables, etc.), 3) enzymes and bacteria, 4) marine products (fish, shellfish, crustaceans, and mollusks), 5) pharmaceuticals and biological samples, 6) food and beverages, 7) presence and condition of people, animals, and objects, 8) condition of gas (including water vapor), 9) liquid, fluid, water, and humidity, 10) shape, color, internal structure, and physical condition of objects, 11) space, location, and distance, 12) contamination status of objects, 13) condition of molecules and particles, and 14) industrial waste.

For example, for the purpose of nursing care, the electronic device according to the present embodiment can be used to check excretion and to identify, manage, monitor, and the like of health conditions.

As described above, the electronic device according to the present embodiment can be used for all kinds of applications, such as inspection, detection, measurement, quantification, evaluation, assay, analysis, observation, monitoring, recognition, selection, sorting, and the like.

EXAMPLES

The present embodiment will be described in more detail below with examples and comparative examples, but the present embodiment is not limited to these examples. [Manufacturing of Wavelength Converter]

Example

First, raw materials illustrated in Table 1 were weighed to produce a first phosphor including a composite metal oxide activated with $Cr^{3+}$ through a chemical reaction. Note that the composite metal oxide activated with $Cr^{3+}$ was made to be a $(Gd, La)_3Ga_2(GaO_4)_3:Cr^{3+}$ phosphor having a garnet-type crystal structure and expressed by a composition formula of $(Gd_{0.95}La_{0.05})_3(Ga_{0.97}Cr_{0.03})_2(GaO_4)_3$. Hereinafter, the $(Gd, La)_3Ga_2(GaO_4)_3:Cr^{3+}$ phosphor is also referred to as a GLGG phosphor. The following materials were used for the raw materials illustrated in Table 1.

Gadolinium oxide $(Gd_2O_3)$: purity 3N, manufactured by NIPPON YTTRIUM CO., LTD.

Lanthanum hydroxide $(La(OH)_3)$: purity 3N, manufactured by Shin-Etsu Chemical Co., Ltd.

Gallium oxide $(Ga_2O_3)$: purity 4N, manufactured by Nippon Rare Metal, Inc.

Chromium oxide $(Cr_2O_3)$: purity 3N, manufactured by Kojundo Chemical Lab. Co., Ltd.

in a nitrogen atmosphere at 1500 to 1600° C. for 2 hours using a tubular atmosphere furnace. Note that the temperature rise and fall rate during calcination was set to 150° C./h. In this way, a sintered body having a plate shape was obtained. The top and bottom surfaces of the sintered body were mechanically polished using a grinder to a thickness of 300 μm, resulting in a sintered body 11D made from a GLGG phosphor.

Furthermore, multiple concave parts 11c as illustrated in FIG. 6(b) were formed by performing notching from the main surface of the sintered body 11D using a dicing saw. Note that the width of each of the concave parts 11 in the x-axis direction was set to 160 μm, and the width of each of the convex parts 11b was also set to 160 μm. Thus, an average length PSm of a profile curve element in the concave-convex structure of the phosphor ceramic was set to 320 μm. The depth of each of the concave parts 11 in the y-axis direction was set to 200 μm.

Next, a $Y_3Al_2(AlO_4)_3:Ce^{3+}$ phosphor (YAG phosphor) was prepared as the second phosphor. A YAG phosphor manufactured by TOKYO KAGAKU KENKYUSHO CO., LTD. and having a median particle size $D_{50}$ of about 24 μm was used. This YAG phosphor had a fluorescence peak at a wavelength of around 540 nm and emitted yellow-green light. Furthermore, a two-liquid mixing type thermosetting silicone resin (manufactured by Shin-Etsu Chemical Co., Ltd., product name: KER-2500A/B) was prepared as a sealant for the YAG phosphor.

Next, the YAG phosphor and the silicone resin were mixed and further defoamed using a stirring and defoaming device. In this way, a phosphor paste made from the YAG phosphor and the silicone resin was produced. Note that the content of the YAG phosphor in the phosphor paste was set to 30% by volume.

Figure 11:
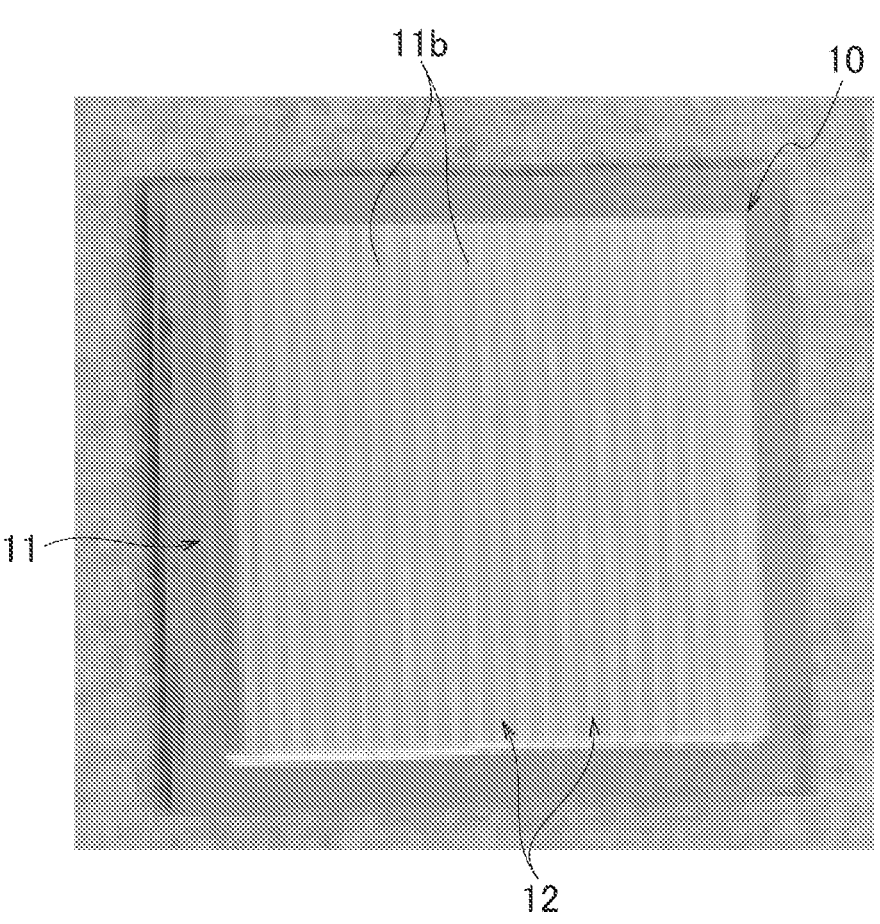
FIG. 11 is a photograph of a wavelength converter produced in a practical example viewed in plan view.

The phosphor paste thus obtained was dropped over the entire concave parts 11c of the phosphor ceramic. The phosphor ceramic in which the concave parts 11 were filled with the phosphor paste was heating in air at 150° C. for 2 hours, and thus the phosphor paste was hardened. Consequently, the wavelength converter as illustrated in FIG. 6(c) was obtained. Furthermore, by polishing the bottom wall part 11f of the wavelength converter to remove it, the wavelength converter of the present example as illustrated in FIG. 6(d) was obtained. The thickness t of the wavelength converter of the present example was 200 μm. FIG. 11 illustrates a photograph of the obtained wavelength converter viewed in plan view.

(Comparative Example)

First, particles of the GLGG phosphor were produced as follows. Phosphor raw materials were first weighed as illustrated in Table 1. Next, 20 g of the weighed raw

TABLE 1

| General formula | Raw material(g) | | | |
| | $Gd_2O_3$ | $La(OH)_3$ | $Ga_2O_3$ | $Cr_2O_3$ |
| --- | --- | --- | --- | --- |
| $(Gd_{0.95}La_{0.05})_3(Ga_{0.97}Cr_{0.03})_2Ga_3O_{12}$ | 10.213 | 0.563 | 9.154 | 0.090 |

Next, after mixing the weighed raw materials, the phosphor raw material was filled in a die of Φ13 mm and was press-formed at a gauge pressure of about 2 MPa to obtain a compact of the phosphor raw material in a plate shape. The compact was then placed on an alumina plate arranged on a large alumina calcining boat, and calcination was performed materials was further put into an alumina pot mill having a capacity of 250 ml, and alumina balls and 60 ml of ethanol were put into the pot mill. The alumina balls had a diameter of φ3 mm and were put in a total of 200 g. The pot mill was then mixed using a planetary ball mill at a rotation speed of 150 rpm for 30 minutes.

The alumina balls were then removed using a sieve to obtain a slurry-like mixed raw material of raw materials and ethanol. The slurry-like mixed raw material was then entirely dried at 125° C. using a dryer. The dried mixed raw material was then lightly mixed using a mortar and pestle to make a phosphor raw material.

Next, the phosphor raw material was put in an alumina calcining vessel (material SSA-H, size B3, with lid) and calcined for 2 hours in air at 1500° C. using a box-shaped electric furnace. Note that the rise and fall rate during calcination was set at 300° C./h.

The obtained calcined product was hand-crushed using an alumina mortar and pestle, and coarse particles were removed by passing it through a nylon mesh (95 μm mesh opening). This gave a powdery GLGG phosphor expressed by the composition formula $(Gd_{0.95}La_{0.05})_3(Ga_{0.97}Cr_{0.03})_2(GaO_4)_3$.

Next, a first phosphor sheet was produced using this GLGG phosphor. Specifically, the silicone resin and the GLGG phosphor were first weighed in such a manner that the filling ratio of the GLGG phosphor powder in the resin was 30% by volume. Note that the same silicone resin was used as in the example. The silicone resin and the phosphor powder were then mixed using a mortar and pestle. The obtained mixture was then subjected to vacuuming (deforming process) to obtain phosphor paste.

Next, the phosphor paste was dropped on a glass substrate and the surface was smoothed using a squeegee. Then, the phosphor paste was heated in air at 150° C. for 2 hours to be hardened, and thus a first phosphor sheet was obtained. Note that the thickness of the first phosphor sheet was made 100 μm.

Furthermore, a second phosphor sheet was produced using the same YAG phosphor as in the example. Specifically, the silicone resin and the YAG phosphor were first weighed in such a manner that the filling ratio of the YAG phosphor powder in the resin was 30% by volume. Note that the same silicone resin was used as in the example. Next, the silicone resin and the phosphor powder were mixed using a mortar and pestle. The obtained mixture was then subjected to vacuuming (defoaming process) to obtain phosphor paste.

The phosphor paste was then dropped on a glass substrate and the surface was smoothed using a squeegee. The phosphor paste was heated in air at 150° C. for 2 hours to be hardened, and thus a second phosphor sheet was obtained. No that the thickness of the second phosphor sheet was made 100 μm.

Figure 12:
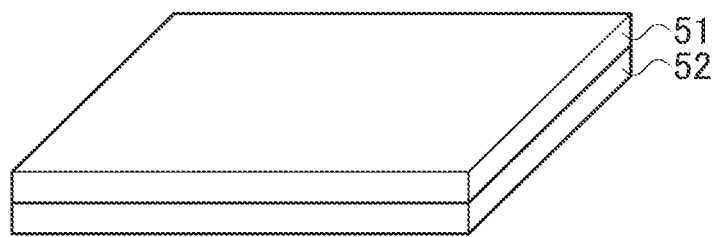
FIG. 12 is a schematic perspective view of a wavelength converter according to a comparative example.

Then, as illustrated in FIG. 12, the wavelength converter of the present example was obtained by superimposing an obtained first phosphor sheet 51 and a second phosphor sheet 52. Note that the thickness of the wavelength converter of the present example was 200 μm.

[Evaluation]

The wavelength converters of the example and comparative example were irradiated with laser light, and the radiant flux and spectral distribution of output light emitted from the wavelength converters were measured. Specifically, the main surface of the wavelength converters of the example and comparative example was irradiated with laser light, and then the output light emitted from the wavelength converters was integrated using an integrating sphere (φ20 inch, product number: LMS-200, manufactured by Labsphere). Then, a total luminous flux measurement system (product number: SLMS-CDS-2021, manufactured by Labsphere) was used to measure the radiant flux and spectral distribution of the output light. Note that the laser light was blue light having a wavelength of 450 nm, and the outputs were set to 0.5 W, 1.0 W, 1.5 W, 2.0 W, 2.5 W, and 3.0 W. The wavelength converter of the comparative example was irradiated with laser light from the side of the second phosphor sheet in which a YAG phosphor was dispersed.

Figure 13:
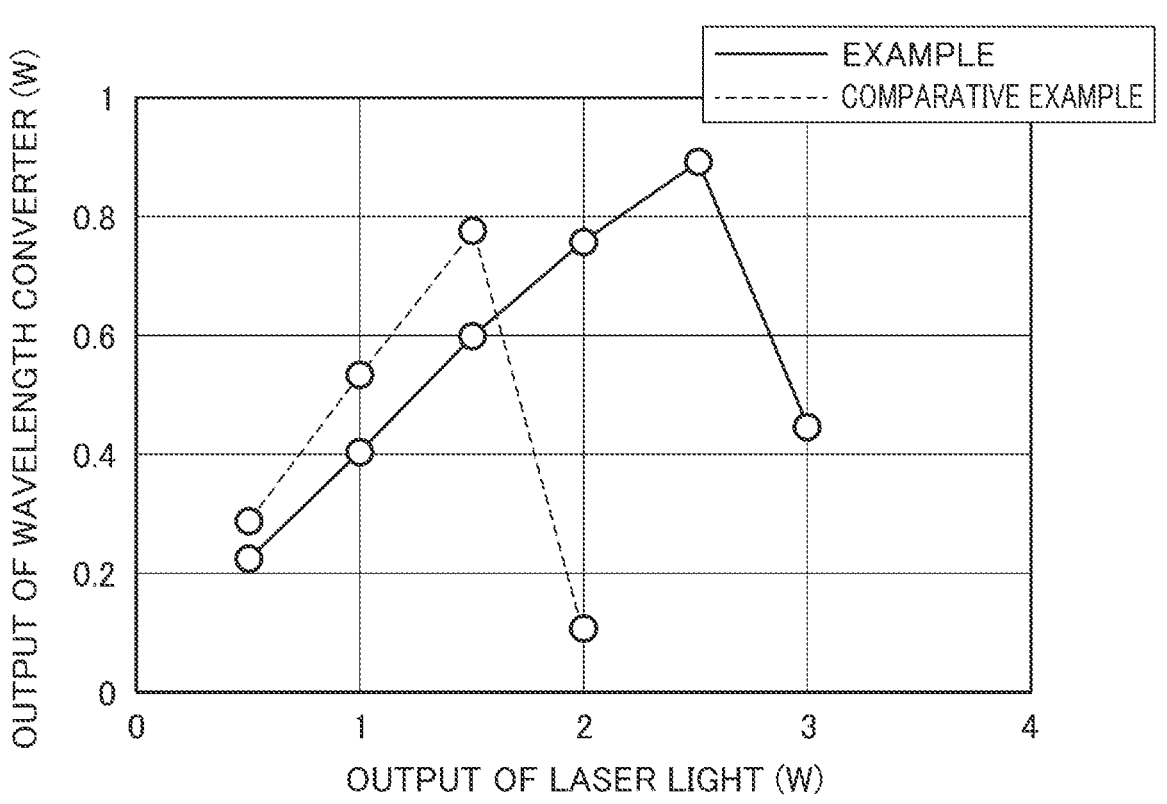
FIG. 13 is a graph illustrating a relationship between output of laser light when the laser light is emitted as excitation light and output of fluorescence emitted from each of the wavelength converters according to the practical example and the comparative example.

FIG. 13 illustrates a relationship between the laser light output and the fluorescence output (radiation flux) emitted from the wavelength converter with regard to the example and comparative example wavelength converters. As can be seen from FIG. 13, the output from the wavelength converter of the example tended to increase as the laser light output increased. Note that when the laser light output reached 3 W, the output from the wavelength converter decreased because the silicone resin in the phosphor part was burnt and blackened. In addition, the output from the wavelength converter of the comparative example also tended to increase as the laser light output increased. However, when the laser light output reached 2 W, the silicone resin was burnt and blackened, resulting in a decrease in the output from the wavelength converter.

Thus, it can be seen that the wavelength converter of the example has a higher output of emitted fluorescence compared to that of the comparative example. In addition, it can be seen that the wavelength converter of the example has higher heat dissipation and superior heat resistance compared to those of the comparative example.

Figure 14:
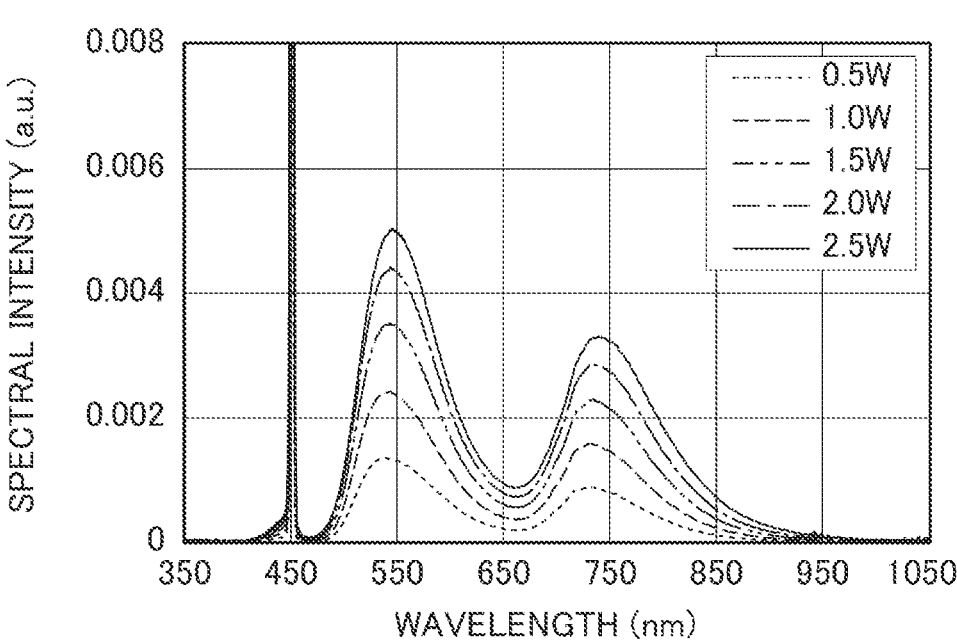
FIG. 14 is a graph illustrating a relationship between the output of laser light when the laser light is emitted as excitation light and the spectral distribution of fluorescence emitted from the wavelength converter according to the practical example.
Figure 15:
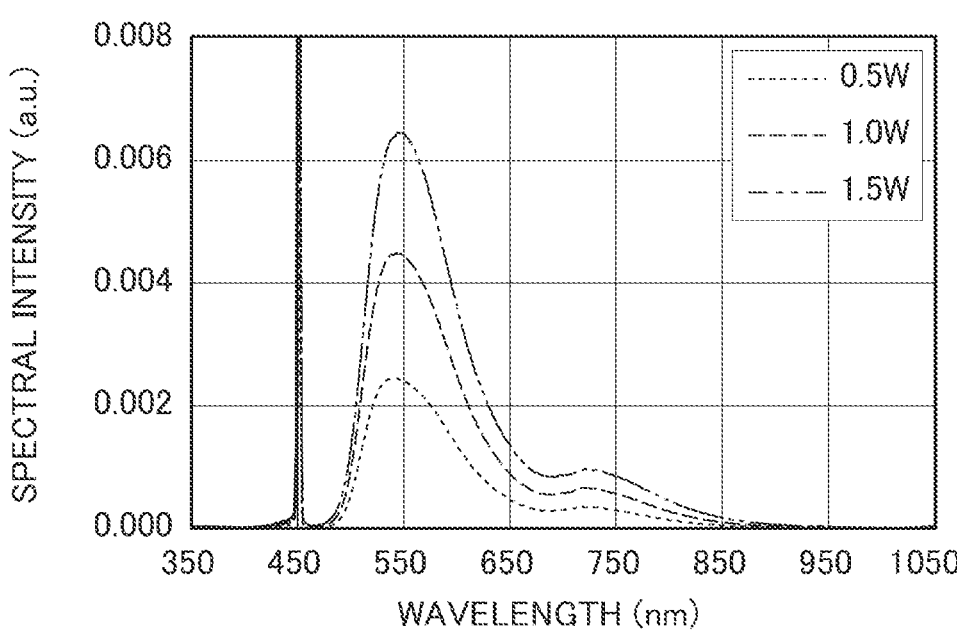
FIG. 15 is a graph illustrating a relationship between the output of laser light when the laser light is emitted as excitation light and the spectral distribution of fluorescence emitted from the wavelength converter according to the comparative example.

FIG. 14 illustrates a relationship between the output of laser light and the spectral distribution of output light emitted from the wavelength converter of the example when the wavelength converter is irradiated with laser light. FIG. 15 also illustrates a relationship between the output of laser light and the spectral distribution of output light emitted from the wavelength converter of the comparison example when the wavelength converter is irradiated with laser light.

From FIG. 14, spectral distributions having light emission peaks near the wavelength of 550 nm and near the wavelength of 740 nm were obtained in the wavelength converter of the example. Therefore, it can be seen that the wavelength converter of the example can emit both green light and near-infrared light with high efficiency. It can also be seen that even when the laser light output is increased from 0.5 W to 2.5 W, both green light and near-infrared light can be emitted with high efficiency. In contrast, FIG. 15 illustrates that the wavelength converter of the comparative example has a strong light emission peak near the wavelength of 550 nm, but the light emission peak near the wavelength of 740 nm is greatly reduced compared with the example. The reason for this is considered to be that more laser light is absorbed by the YAG phosphor, resulting in insufficient absorption by the GLGG phosphor. It can also be seen that when the output of laser light is increased from 0.5 W to 1.5 W, the intensity of green light improves, but that of near-infrared light does not improve significantly.

Thus, it can be seen that the wavelength converter of the example can emit both the fluorescence due to a parity-forbidden transition and the fluorescence due to a parity-allowed transition with high efficiency without using a rotary driving device.

Although the present embodiment has been described above, the present embodiment is not limited to these descriptions, and various modifications are possible within the scope of the gist of the present embodiment.

The entire contents of Japanese Patent Application No. 2021-024564 (filed Feb. 18, 2021) are incorporated herein by reference.

INDUSTRIAL APPLICABILITY

The present disclosure makes it possible to provide a wavelength converter capable of enhancing the lighting emitting efficiency of a phosphor without using a rotary driving device, and a lighting emitting device using the wavelength converter.

REFERENCE SIGNS LIST

10, 10A, 10B, 10C Wavelength converter
11, 11A, 11B, 11C Phosphor ceramic
11*a* Main surface of phosphor ceramic
11*b* Convex parts
11*c* Concave parts
12, 12B, 12C Phosphor part
20 Solid-state light source
100, 100A Light emitting device
The invention claimed is:

1. A wavelength converter, comprising:
   a phosphor ceramic made entirely from an inorganic material, the phosphor ceramic containing a first phosphor that emits fluorescence due to a parity-forbidden transition; and
   a phosphor part containing a second phosphor that emits fluorescence due to a parity-allowed transition, wherein
   a main surface of the phosphor ceramic has a concave and convex structure including a plurality of convex parts and a plurality of concave parts, and
   the phosphor part is arranged inside the plurality of concave parts in the phosphor ceramic.

2. The wavelength converter according to claim 1, wherein in the phosphor ceramic with the phosphor part not arranged inside the concave parts, an average length PSm of a profile curve element in the concave and convex structure is 400 μm or less.

3. The wavelength converter according to claim 1, wherein the first phosphor is a phosphor that contains Cr as a light emission center element and has a light emission peak within a wavelength range of 700 nm or more and less than 1600 nm.

4. The wavelength converter according to claim 1, wherein the second phosphor is a phosphor that contains Ce as a light emission center element and has a light emission peak within a wavelength range of 500 nm or more and less than 600 nm.

5. The wavelength converter according to claim 1, wherein the phosphor ceramic and the phosphor part are alternately stacked when viewed in plan view.

6. The wavelength converter according to claim 1, wherein when viewed in plan view, the phosphor part is arranged in a separated manner with the phosphor ceramic therebetween, or the phosphor ceramic is arranged in a separated manner with the phosphor part therebetween.

7. The wavelength converter according to claim 1, wherein the phosphor ceramic has a thermal conductivity greater than that of the phosphor part.

8. The wavelength converter according to claim 1, wherein the phosphor part further contains a third phosphor that has a light emission peak within a wavelength range of 600 nm or more and less than 700 nm.

9. A light emitting device, comprising:
   the wavelength converter according to claim 1; and
   a solid-state light source that emits light with which the wavelength converter is irradiated and which has a light emission peak within a wavelength range of 400 nm or more and less than 500 nm.

10. The wavelength converter according to claim 1, wherein the phosphor ceramic is a molded body that is made entirely from the inorganic material and contains the first phosphor.

11. The wavelength converter according to claim 1, wherein the phosphor ceramic is a sintered body containing the first phosphor.

12. The wavelength converter according to claim 1, wherein the phosphor ceramic is a molded body obtained by binding particles of the first phosphor using an inorganic binder.

13. The wavelength converter according to claim 1, wherein the phosphor part is in direct contact with the phosphor ceramic.

14. The wavelength converter according to claim 1, wherein the phosphor part is a sealed body formed by sealing particles of the second phosphor with a sealant, the sealant being at least one of a transparent organic materials or a transparent inorganic material.

\* \* \* \* \*